United States Patent
Chen

(10) Patent No.: US 10,748,792 B2
(45) Date of Patent: Aug. 18, 2020

(54) METHOD AND SYSTEM FOR MASS ARRANGEMENT OF MICRO-COMPONENT DEVICES

(71) Applicant: MAVEN OPTRONICS CO., LTD., Hsinchu County (TW)

(72) Inventor: Chieh Chen, Palo Alto, CA (US)

(73) Assignee: Maven Optronics Co., Ltd., Hsinchu County (TW)

(*) Notice: Subject to any disclaimer, the term of this patent is extended or adjusted under 35 U.S.C. 154(b) by 54 days.

(21) Appl. No.: 16/147,546

(22) Filed: Sep. 28, 2018

(65) Prior Publication Data

US 2019/0115233 A1 Apr. 18, 2019

(30) Foreign Application Priority Data

Oct. 13, 2017 (TW) .............. 106135119 A
Oct. 16, 2017 (CN) .............. 2017 1 0970476

(51) Int. Cl.
*H01L 21/64* (2006.01)
*H01L 21/67* (2006.01)
(Continued)

(52) U.S. Cl.
CPC ......... *H01L 21/67121* (2013.01); *F15D 1/00* (2013.01); *H01L 21/6835* (2013.01);
(Continued)

(58) Field of Classification Search
None
See application file for complete search history.

(56) References Cited

U.S. PATENT DOCUMENTS 6,687,987 B2 * 2/2004 Mayer ............... B82Y 30/00
                                                  257/E21.705
8,349,116 B1   1/2013 Bibl et al.
(Continued)

FOREIGN PATENT DOCUMENTS

CN   106816451 A   6/2017
JP   2003-142738 A  5/2003
(Continued)

OTHER PUBLICATIONS

Extended Search Report for corresponding European Patent Application No. 18197418.9, dated Mar. 19, 2019, 6 pages.
(Continued)

*Primary Examiner* — Bradley Smith
(74) *Attorney, Agent, or Firm* — Foley & Lardner LLP

(57) ABSTRACT

A method for mass arrangement of micro-component devices includes the following process stages: disposing the micro-component devices to float on a liquid suspending medium, wherein the micro-component devices are spaced apart from each other with a larger initial gap along a first direction and along a second direction; using electromagnetic force to actuate the floating micro-component devices to move closer so that the micro-component devices become spaced apart from each other with a smaller specified target gap along the first and the second directions; and transferring the arranged micro-component devices with the target gap on a carrier substrate. A system for arranging the micro-component devices is also disclosed to implement the method. Therefore, a precisely arranged array of the micro-component devices can be formed on a target application substrate.

19 Claims, 29 Drawing Sheets

(51) Int. Cl.
*H01L 25/075* (2006.01)
*H01L 23/00* (2006.01)
*F15D 1/00* (2006.01)
*H01L 21/683* (2006.01)
*H01L 25/13* (2006.01)

(52) U.S. Cl.
CPC .............. *H01L 24/83* (2013.01); *H01L 24/95* (2013.01); *H01L 25/0753* (2013.01); *H01L 25/13* (2013.01); *H01L 2224/75101* (2013.01); *H01L 2224/83002* (2013.01); *H01L 2224/83005* (2013.01); *H01L 2224/83085* (2013.01); *H01L 2224/83192* (2013.01); *H01L 2224/95001* (2013.01); *H01L 2224/95085* (2013.01); *H01L 2224/95133* (2013.01); *H01L 2224/95136* (2013.01); *H01L 2224/95146* (2013.01); *H01L 2924/00014* (2013.01); *H01L 2924/12041* (2013.01); *H01L 2924/1461* (2013.01)

(56) References Cited

U.S. PATENT DOCUMENTS

| | | | |
|---|---|---|---|
| 9,137,935 B2 * | 9/2015 | Morris | H01L 24/95 |
| 9,550,353 B2 | 1/2017 | Bower et al. | |
| 10,418,527 B2 * | 9/2019 | Sasaki | H01L 33/486 |
| 2009/0265929 A1 | 10/2009 | Nakagawa et al. | |
| 2013/0027623 A1 | 1/2013 | Negishi et al. | |
| 2013/0126589 A1 | 5/2013 | Bibl et al. | |
| 2013/0130416 A1 | 5/2013 | Bibl et al. | |
| 2017/0062393 A1 * | 3/2017 | Kim | H01L 21/6835 |
| 2017/0133558 A1 | 5/2017 | Sasaki et al. | |
| 2019/0357395 A1 * | 11/2019 | Ahn | H05K 13/0409 |

FOREIGN PATENT DOCUMENTS

| | | | |
|---|---|---|---|
| JP | 2004-131363 A | 4/2004 |
| JP | 2011-100832 A | 5/2011 |
| KR | 2008-0047616 A | 5/2008 |
| KR | 2012-0138805 A | 12/2012 |
| TW | 201327910 A | 7/2013 |
| TW | 201330323 A | 7/2013 |
| TW | 201347085 A | 11/2013 |
| WO | WO-98/15983 A1 | 4/1998 |
| WO | WO-2007/037381 A1 | 4/2007 |
| WO | WO-2008/060455 A2 | 5/2008 |
| WO | WO-2012/008253 A1 | 1/2012 |
| WO | WO-2013/074370 A1 | 5/2013 |
| WO | WO-2013/158949 A1 | 10/2013 |
| WO | WO-2016/084672 A1 | 6/2016 |

OTHER PUBLICATIONS

Tkachenko, Anton et al., "Evaluation of Directed Self-Assembly Process for LED Assembly on Flexible Substrates", IEEE, 34th Electronic Components Conference, May 28, 2013, pp. 546-552.
Office Action from corresponding Taiwan Patent Application No. 106135119, dated May 15, 2018, 4 pages.
Search Report from corresponding Taiwan Patent Application No. 106135119, dated May 15, 2018, 1 page.
Notice of Allowance in corresponding Japanese Patent Application No. 2018-188895, dated Sep. 10, 2019, 3 pages.
Office Action in corresponding South Korean Patent Application No. 10-2018-0119636, dated Feb. 13, 2020, 5 pages.

* cited by examiner

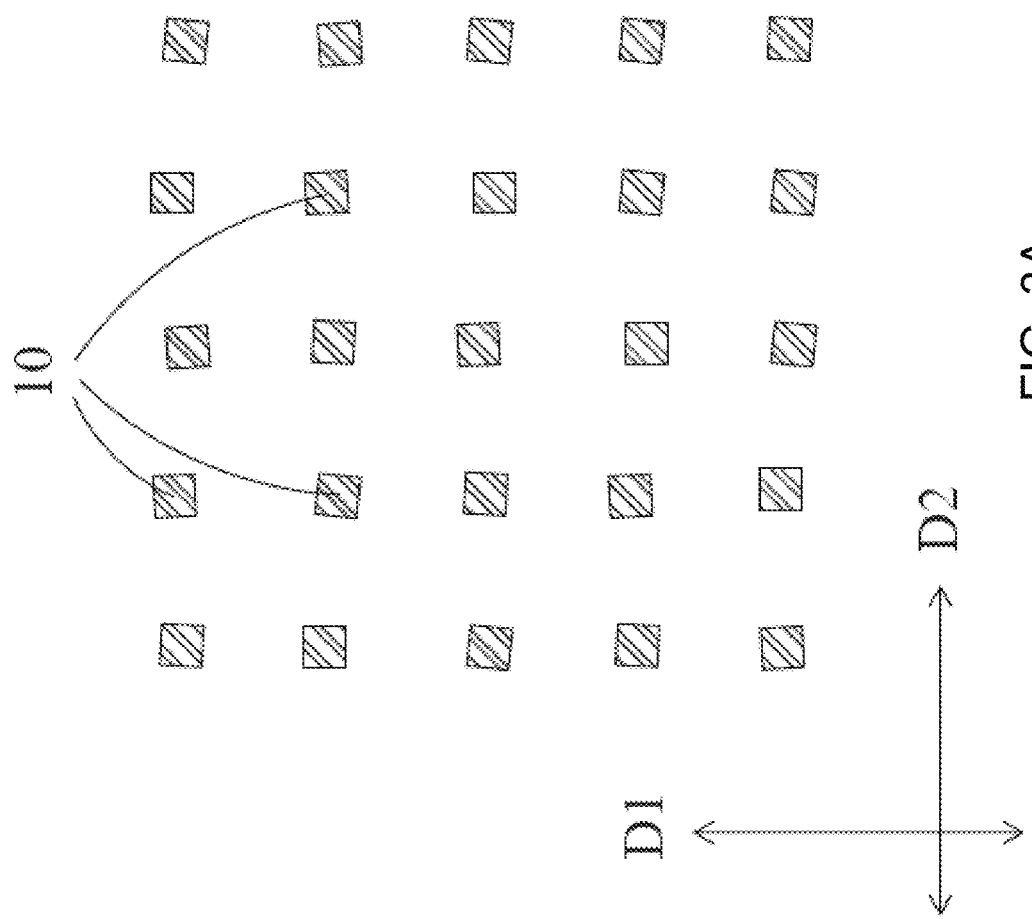

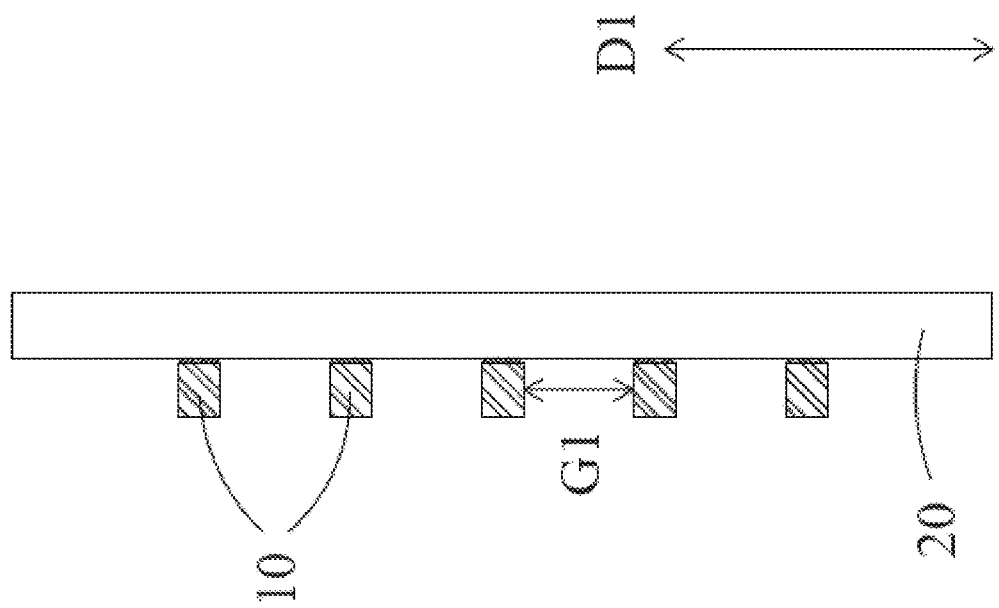

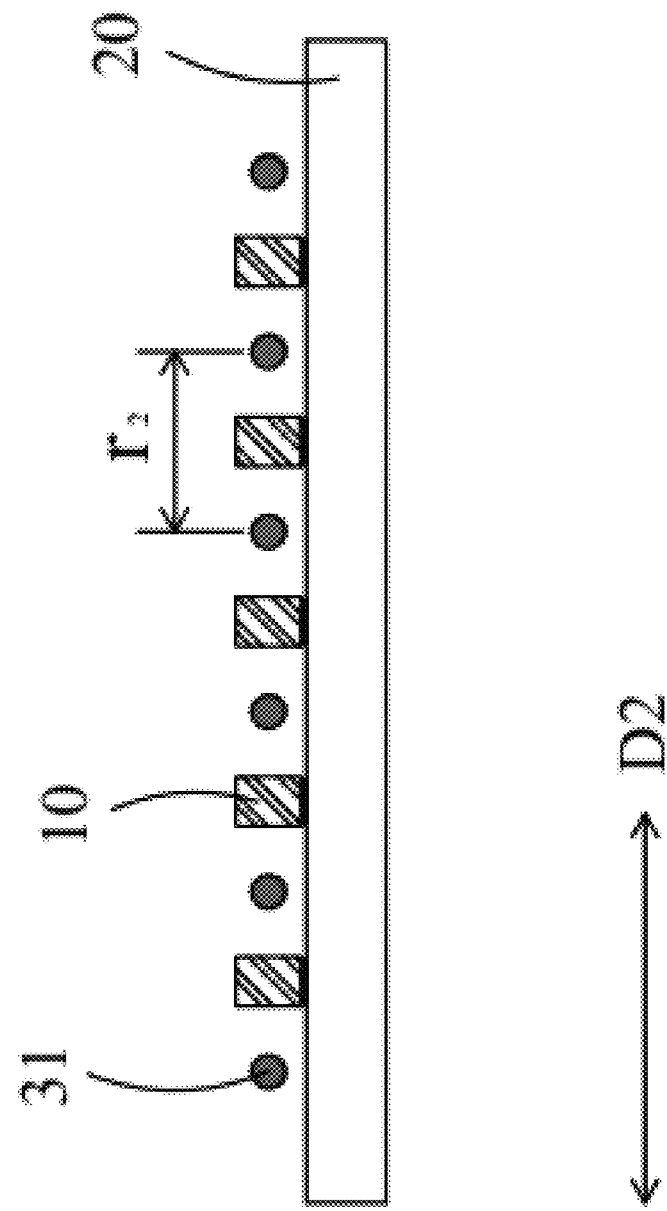

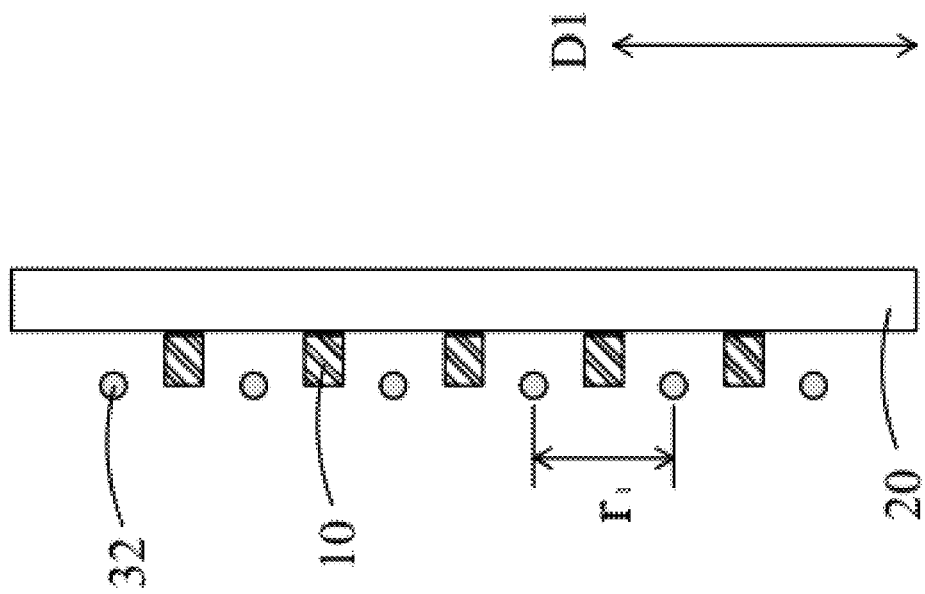

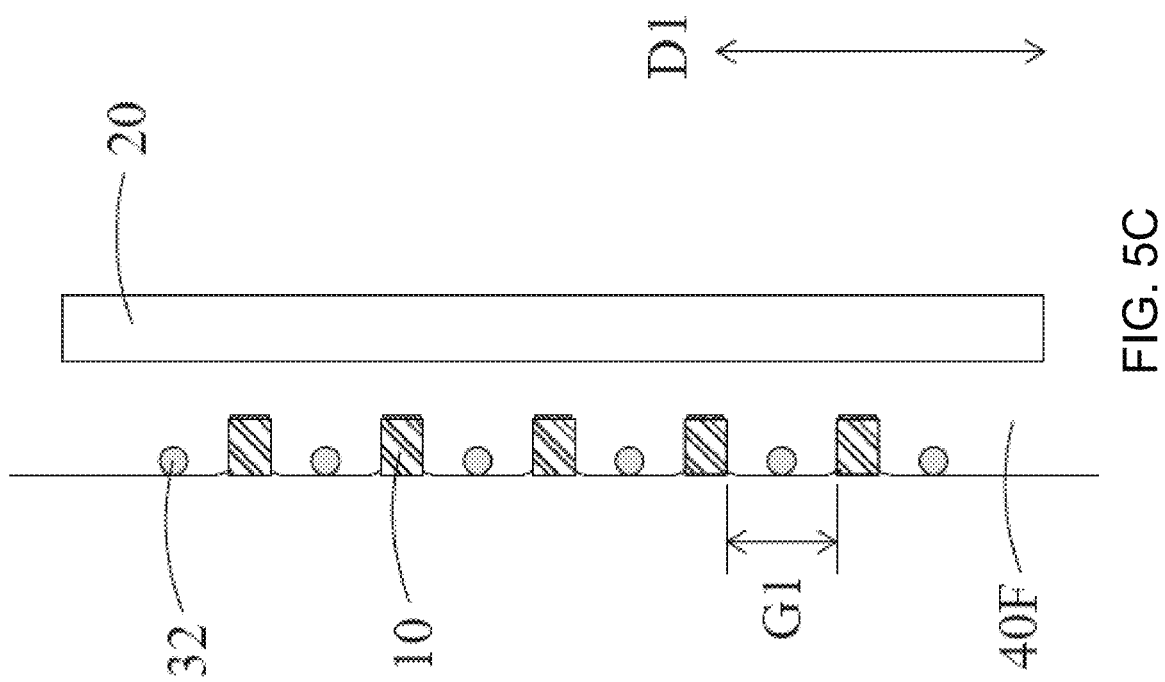

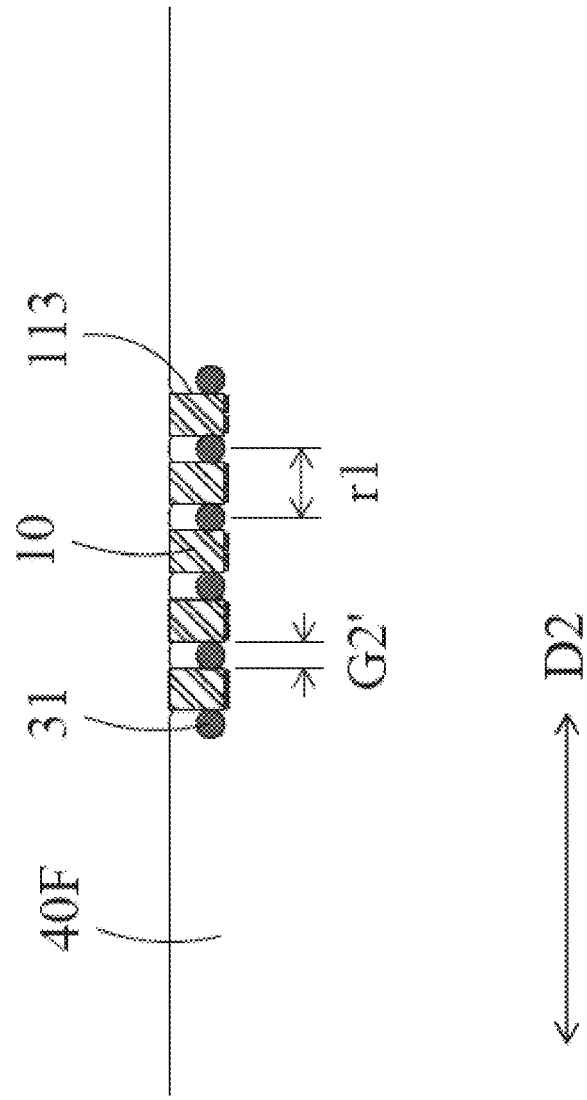

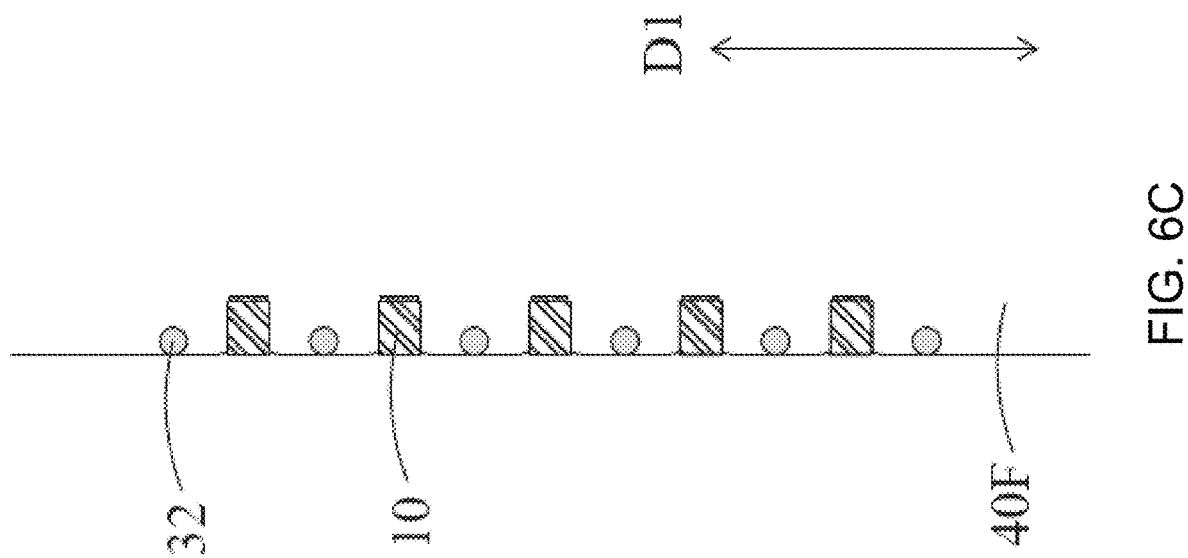

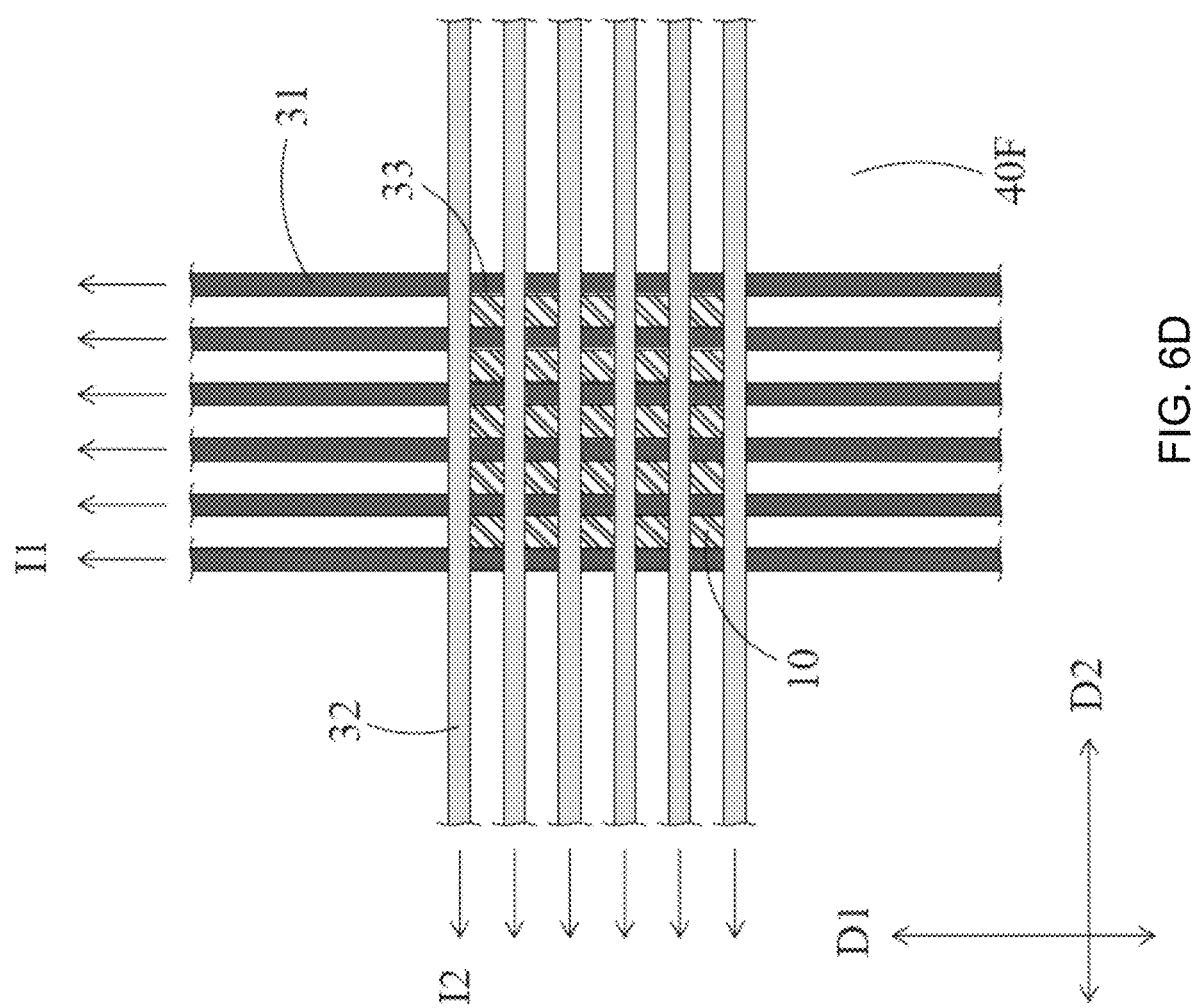

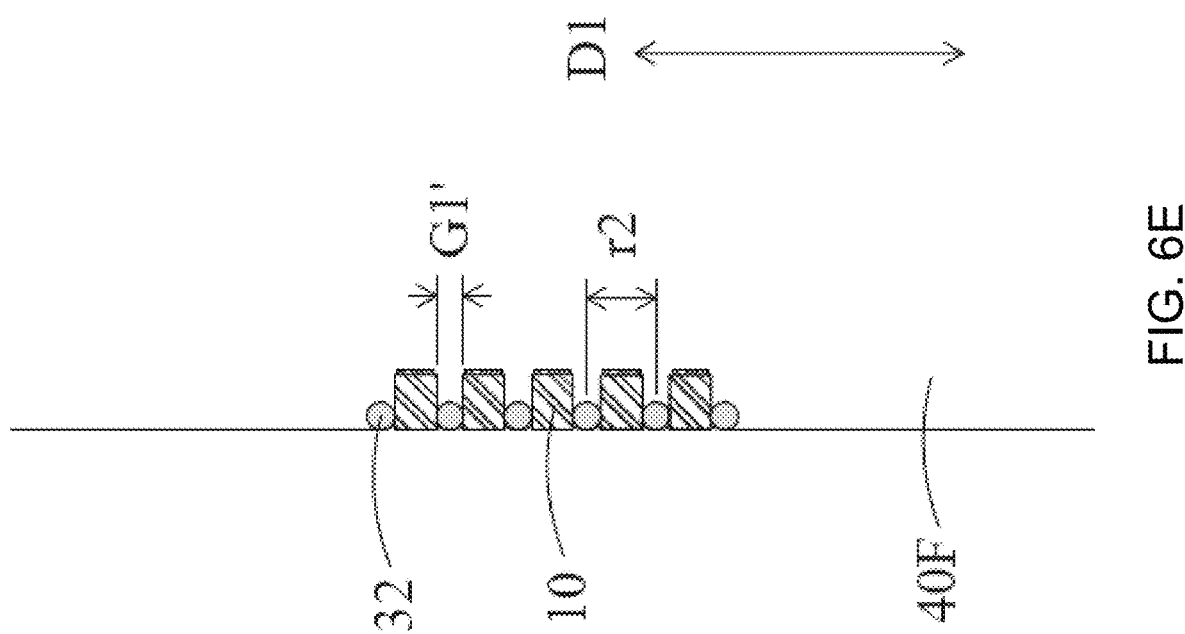

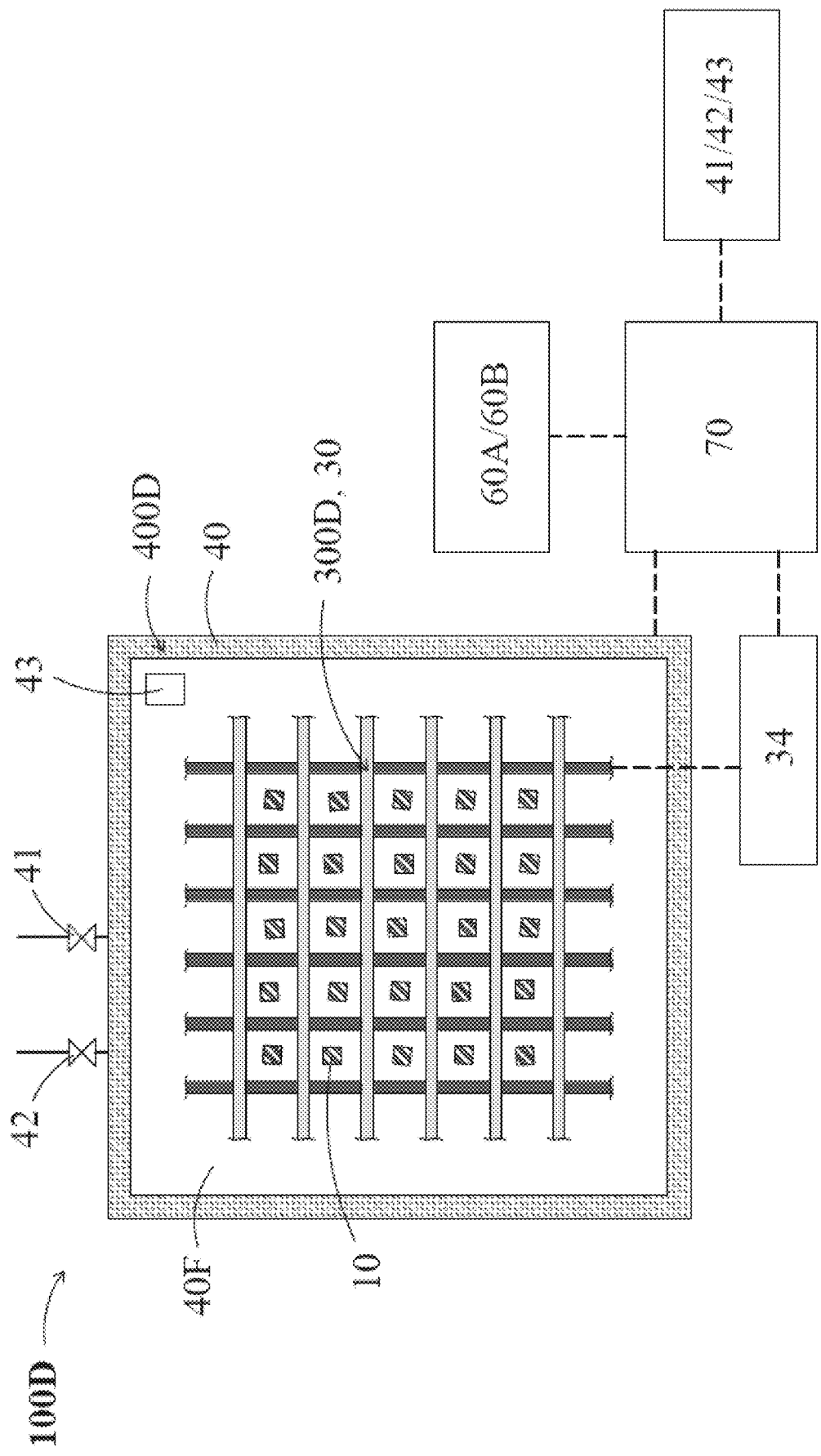

METHOD AND SYSTEM FOR MASS ARRANGEMENT OF MICRO-COMPONENT DEVICES

CROSS-REFERENCE TO RELATED APPLICATIONS

This application claims the benefit of and priority to Taiwan Patent Application No. 106135119 filed on Oct. 13, 2017, and Chinese Patent Application No. 201710970476.1 filed on Oct. 16, 2017, the disclosures of which are incorporated herein by reference in their entirety.

BACKGROUND

Technical Field

The present disclosure relates to a method and system for arranging component devices, and more particularly to a method and system for arranging a large number of micro-component devices.

Description of the Related Art

Light-emitting diodes (LEDs) have been developed for decades. In addition to traditional LED applications, such as indicator lights, illumination sources, backlight modules for liquid crystal displays (LCD), and outdoor large-scale display panels, applications of LEDs are now moving toward fine-pitch miniaturized LED (micro-LED) display devices. That is, through a semiconductor lithography process technology, the size of an LED chip can be fabricated at around a micrometer level. For example, the size of a micro-LED can be similar to or smaller than a pixel size of a display device. The micro-LED chips are arranged into an array (a micro-LED array), transferred and electrically bonded to an application circuit board having a driving circuit (in combination with other circuitry components), thereby forming a display device, wherein each pixel of the display device may include one or a plurality of micro-LED chips, and each pixel is controlled by an array of active-matrix (AM) thin-film transistors (TFT) or passive-matrix (PM) driving integrated circuits (ICs) to form the display device. A display device comprising a plurality of micro-LED chips is referred to as a micro-LED display device.

Compared with an organic light-emitting diode (OLED), since a micro-LED chip is composed of an inorganic material, the micro-LED chip is less susceptible to moisture and oxygen from the environment, and can have a longer lifetime. In addition, the emitting spectrum of a micro-LED chip has a narrower Full Width at Half Maximum (FWHM), so a display device comprising micro-LED chips has a higher color purity and can reach a wider color gamut. Furthermore, the electroluminescent conversion efficiency of the micro-LED chip is much higher than a comparable OLED, so that the micro-LED chip can be used to make a high-brightness display device by using a small size of a light emitting area. Therefore, even if the light emitting area of the micro-LED chip occupies a small portion of the overall area in a single pixel, it is sufficient to produce a high-definition contrast display device.

In addition, it is difficult to form a uniform thin film using an organic light-emitting material during the manufacturing process of OLED display devices, resulting in a so-called Mura effect. On the other hand, micro-LED chips can be pre-tested according to their electrical and optical properties after fabricating the micro-LED chips, and then the micro-LED chips with similar electrical and optical properties can be sorted and bonded on the same display device. Therefore, the display device made by the micro-LED chips with relatively similar electrical and optical properties can avoid the uneven-color Mura effects.

Even though a micro-LED display device has the above-mentioned technical merits, however, when a large number of micro-LED chips sorted by similar electrical and optical properties are used to manufacture the display device, some technical challenges arise and should be overcome or improved. For example, challenges arise in how to accurately arrange a large number of micro-LED chips into a micro-LED array to form a display device, how to transfer and electrically bond the array of micro-LEDs to a circuit board with a driving circuit to form a micro-LED display device, and the like. Especially for high-resolution display devices, it may take more than a million micro-LED chips to be arranged and transferred, making the micro-LED display fabrication process challenging and time consuming.

Therefore, there is a need for a method and system to accurately and efficiently arrange micro-LED chips (or other micro-component devices) into an orderly array and/or transfer the micro-LED chip array onto an application circuit board.

SUMMARY

One object of some embodiments of the present disclosure is to provide a method and system for arranging a plurality of micro-component devices, wherein the plurality of micro-component devices can be arranged into an array accurately and effectively, and allow subsequent manufacturing processes such as mass transfer of the micro-component devices between substrates.

In order to achieve the above object, a method of arranging micro-component devices according to some embodiments of the present disclosure comprises: disposing a plurality of micro-component devices to float on a surface of a liquid suspending medium, wherein the micro-component devices are initially spaced apart with a first-direction initial gap along a first direction and initially spaced apart with a second-direction initial gap along a second direction, the first direction being transverse (e.g., substantially perpendicular) to the second direction; actuating the micro-component devices floating on the surface of the liquid suspending medium to move into closer proximity by using electromagnetic forces, so that the micro-component devices have a first-direction target gap along the first direction and a second-direction target gap along the second direction, wherein the first-direction target gap and the second-direction target gap are smaller than the corresponding first-direction initial gap and the corresponding second-direction initial gap, respectively; and transferring the micro-component devices floating on the surface of the liquid suspending medium onto a carrier substrate, wherein the micro-component devices are arranged at intervals with the corresponding first-direction target gap along the first direction and the corresponding second-direction target gap along the second direction.

In order to achieve the above object, a method of arranging micro-component devices according to some embodiments of the present disclosure comprises: disposing a plurality of micro-component devices to float on a surface of a liquid suspending medium, wherein the micro-component devices are initially spaced apart in an initial array with an initial density; actuating the micro-component devices floating on the surface of the liquid suspending medium to move into closer proximity by using electromagnetic forces, so that the micro-component devices are spaced apart in a target array with a target density that is higher than the initial density; and transferring the micro-component devices floating on the surface of the liquid suspending medium onto a carrier substrate, while maintaining the target density.

In order to achieve the above object, a micro-component device arrangement system according to some embodiments of the present disclosure comprises: a liquid chamber module comprising a liquid chamber for accommodating liquid suspending medium; and a micro-component device arrangement module comprising a conductive wire assembly, wherein the conductive wire assembly includes a plurality of first conductive wires along a first direction and a plurality of second conductive wires along a second direction. The first conductive wires and the second conductive wires are disposed in the liquid chamber, and the first direction is transverse (e.g., substantially perpendicular) to the second direction. The conductive wire assembly defines an array of grids, each of which is defined by the two adjacent and parallel first conductive wires and two adjacent and parallel second conductive wires.

Thereby, the method and system for arranging micro-component devices according to some embodiments of the present disclosure can provide at least the following technical benefits. (1) Compared with a pick-and-place method, wherein a small number of micro-component devices can be transferred sequentially, a mass arrangement method using the micro-component device arrangement method and system according to some embodiments of the present disclosure can arrange an array of micro-component devices simultaneously by: disposing the micro-component devices to float on the surface of the liquid suspending medium simultaneously, actuating the micro-component devices to move closer in proximity to each other by using the electromagnetic force, and then transferring a large number of the micro-component devices from the liquid suspending medium to the carrier substrate simultaneously to effectively and precisely form an array of the micro-component devices with a specified target pitch. (2) By applying electrical energy to the conductive wire assembly to generate attractive magnetic forces among the conductive wires, a grid opening of the conductive wire assembly can be reduced in size and can be actuated so as to move the micro-component devices into closer proximity. (3) The first-direction target gap and the second-direction target gap between the micro-component devices can be accurately controlled by wire diameters of the conductive wires along the second direction and the first direction, respectively. That is, the conductive wires with different wire diameters can be used to adjust the corresponding target gap between the micro-component devices along different directions. (4) The carrier substrate can be an application circuit board with a built-in or integrated driving circuit, and the arranged array of the micro-component devices can be directly mass transferred from the liquid suspending medium to the application circuit board simultaneously, so as to omit another mass transfer process of the micro-component devices.

Other aspects and embodiments of the disclosure are also contemplated. The foregoing summary and the following detailed description are not meant to restrict the disclosure to any particular embodiment but are merely meant to describe some embodiments of the disclosure.

BRIEF DESCRIPTION OF THE DRAWINGS

FIG. 3A, FIG. 3B, and FIG. 3C are schematic diagrams (top view, side view, and front view) of process stages of arranging a low-density array of micro-component devices, wherein the process stages can be part of the method of arranging the micro-component devices as illustrated in FIG. 1.

FIG. 4A, FIG. 4B, and FIG. 4C are schematic diagrams showing process stages of providing a conductive wire assembly, wherein the process stages can be part of the method of arranging the micro-component devices as illustrated in FIG. 1.

FIG. 5A, FIG. 5B, and FIG. 5C are schematic diagrams showing process stages of disposing micro-component devices to float on a surface of a liquid suspending medium, wherein the process stages can be part of the method of arranging the micro-component devices as illustrated in FIG. 1.

FIG. 6A, FIG. 6B, and FIG. 6C are schematic diagrams showing process stages of actuating micro-component devices to move closer in proximity along one direction, wherein the process stages can be part of the method of arranging the micro-component devices illustrated in FIG. 1.

FIG. 6D and FIG. 6E are schematic diagrams showing process stages of actuating micro-component devices to move closer in proximity along another direction, wherein the process stages can be part of the method of arranging the micro-component devices illustrated in FIG. 1.

FIG. 10 is a schematic diagram illustrating a micro-component device arrangement system in accordance with an embodiment of the present disclosure.

DETAILED DESCRIPTION

Definitions

Figure 1:
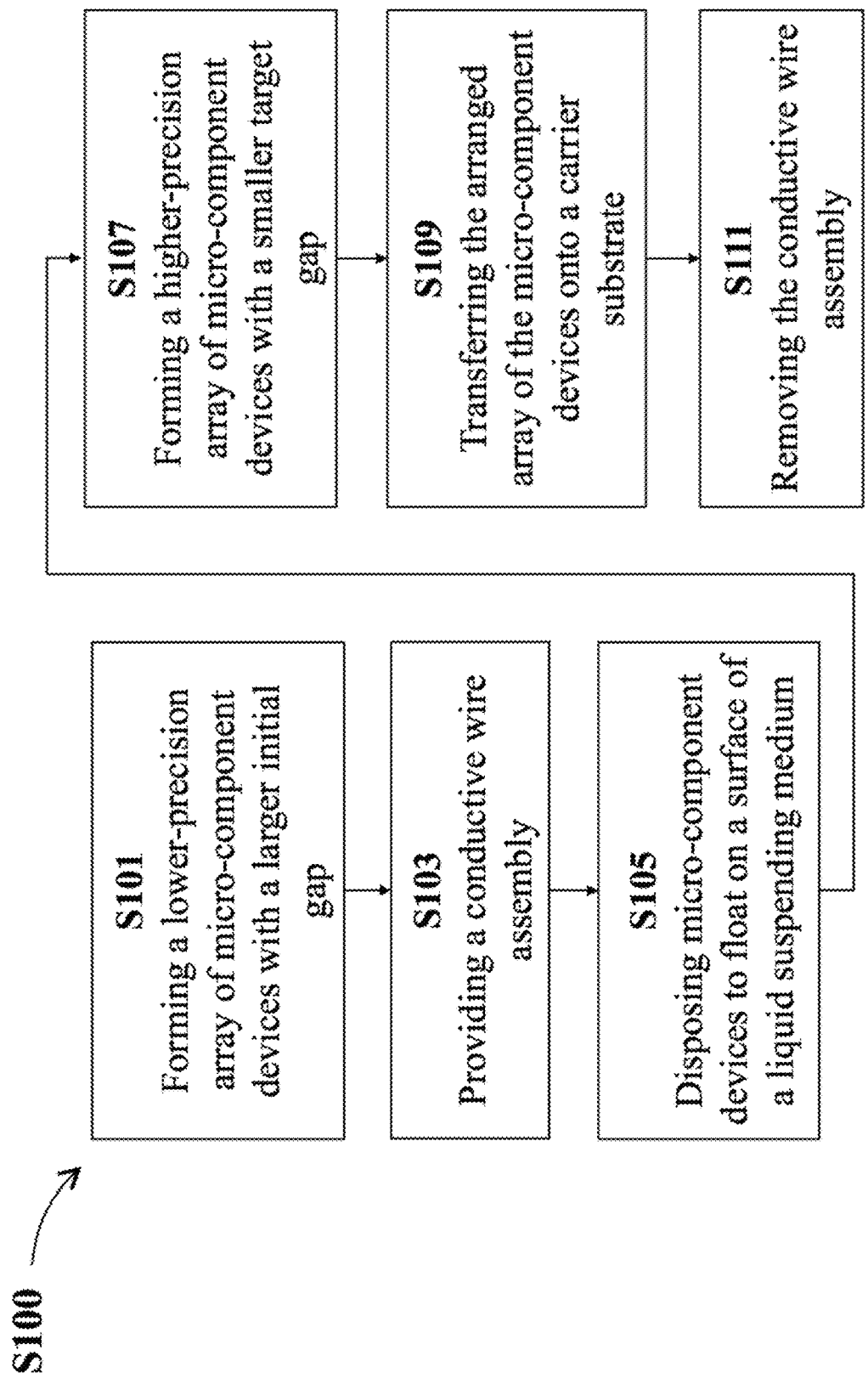
FIG. 1 is a flow chart showing process stages of a method of arranging a plurality of micro-component devices into an orderly array according to an embodiment of the present disclosure.

The following definitions apply to some of the technical aspects described with respect to some embodiments of the disclosure. These definitions may likewise be expanded upon herein.

As used herein, the singular terms "a," "an," and "the" may include plural referents unless the context clearly dictates otherwise. Thus, for example, reference to a layer can include multiple layers unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common properties.

As used herein, the term "adjacent" refers to being near or adjoining. Adjacent components can be spaced apart from one another or can be in actual or direct contact with one another. In some instances, adjacent components can be connected to one another or can be formed integrally with one another. In the description of some embodiments, a component provided "on" or "on top of" another component can encompass cases where the former component is directly on (e.g., in direct physical contact with) the latter component, as well as cases where one or more intervening components are located between the former component and the latter component. In the description of some embodiments, a component provided "underneath" another component can encompass cases where the former component is directly beneath (e.g., in direct physical contact with) the latter component, as well as cases where one or more intervening components are located between the former component and the latter component.

As used herein, the terms "connect," "connected," and "connection" refer to an operational coupling or linking. Connected components can be directly coupled to one another or can be indirectly coupled to one another, such as via another set of components.

As used herein, the terms "about", "substantially", and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same as a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" transparent can refer to a light transmittance of at least 70%, such as at least 75%, at least 80%, at least 85% or at least 90%, over at least a portion or over an entirety of the visible spectrum. For example, "substantially" flush can refer to two surfaces within 20 micrometers of lying along a same plane, such as within 10 micrometers of lying along the same plane, or within 5 micrometers of lying along the same plane. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Figure 2A:
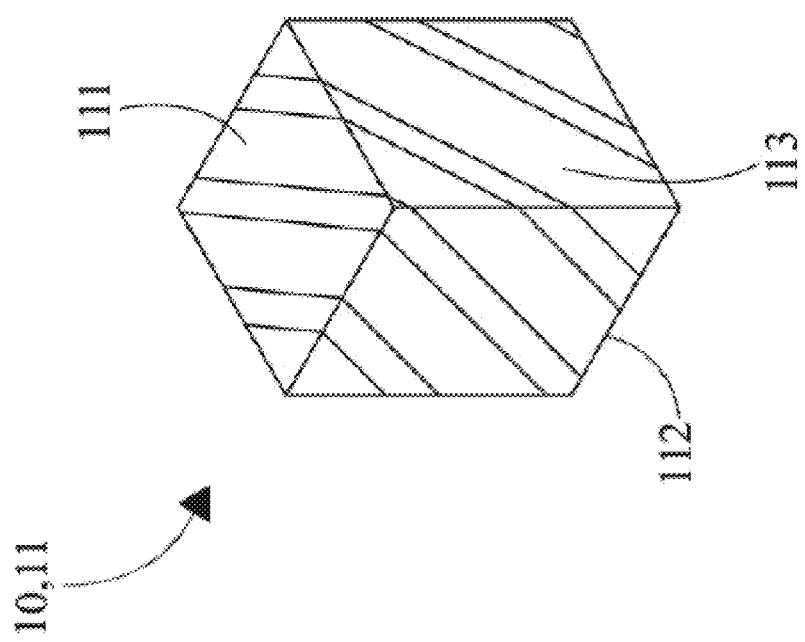
FIG. 2A, FIG. 2B, FIG. 2C, FIG. 2D, and FIG. 2E are schematic views of various configurations of the micro-component devices that can be arranged using the method as illustrated in FIG. 1.

As shown in FIG. 1 is an embodiment of the present disclosure, wherein an arrangement method for micro-component devices (hereinafter referred to as an arrangement method) S100 is illustrated. The method includes the following process stages: Process Stage S101—forming a lower-precision array of micro-component devices with a larger initial gap along the first direction and the second direction; Process Stage S103—providing a conductive wire assembly; Process Stage S105—disposing the micro-component devices to float on a surface of a liquid suspending medium; Process Stage S107—forming a higher-precision array of micro-component devices with a smaller target gap along the first direction and the second direction; Process Stage S109—transferring a resulting arranged array of the micro-component devices onto a carrier substrate; and Process Stage S111—removing the conductive wire assembly. Thereby, the arrangement method S100 can be used to arrange a plurality of micro-component devices 10 (such as shown in FIG. 2A) into an orderly array rapidly, conveniently, and precisely.

Figure 2B:
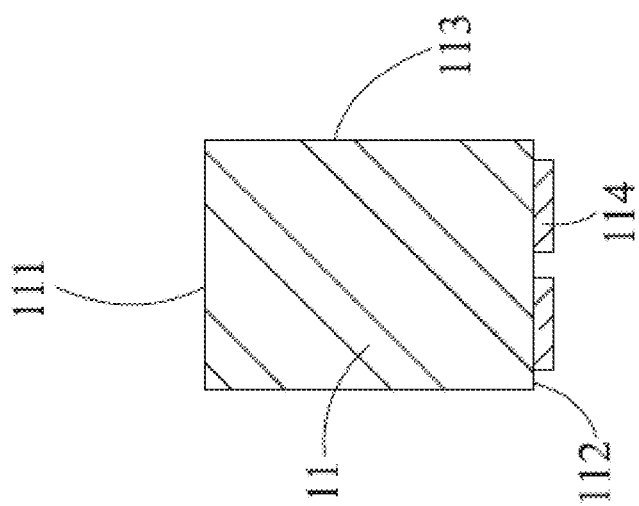

The micro-component devices 10 forming an arranged array using the arrangement method S100 may include components of a micrometer-scale size such as radio frequency components, micro-electro-mechanical components, LED chips, or LED packages. As illustrated in FIG. 2A and FIG. 2B, in one embodiment, each micro-component device 10 can be an LED chip 11, which can be a flip-chip type LED chip that emits light of a specific wavelength (color). For example, the LED chip 11 may be a blue LED chip that emits blue light, a red LED chip that emits red light, or a green LED chip that emits green light. In addition, the light emitted by adjacent LED chips 11 may be of the same wavelength or of different wavelengths.

Structurally, the LED chip 11 includes an upper surface 111, a lower surface 112, an edge surface 113, and a set of electrodes 114. The upper surface 111 and the lower surface 112 are substantially in parallel and oppositely disposed, and the edge surface 113 is formed between the upper surface 111 and the lower surface 112, and connecting a periphery of the upper surface 111 and a periphery of the lower surface 112. In other words, the edge surface 113 is formed along an edge of the upper surface 111 and an edge of the lower surface 112. The set of electrodes 114 is disposed on or adjacent to the lower surface 112 and may have more than two electrodes. Since the set of electrodes 114 is disposed thereon, the lower surface 112 is also referred to as an electrode surface. In other words, the electrode surface does not refer to a lower surface of the set of electrodes 114.

Figure 2C:
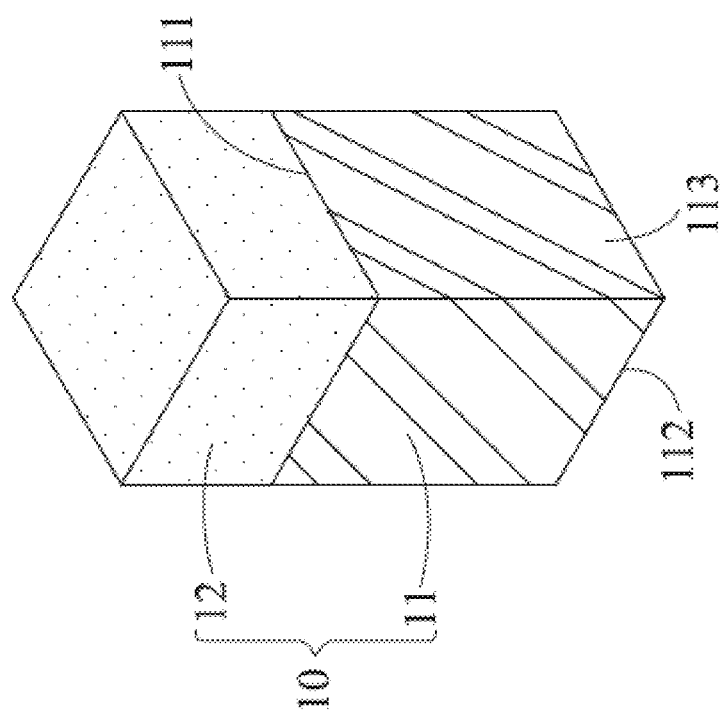

In general, the volumetric mass density (the ratio of mass to volume) of the LED chip 11 is higher than that of a liquid, so that the selection of a liquid suspending medium on which the micro-component device 10 can float should be considered. Therefore, in another embodiment as shown in FIG. 2C, the micro-component device 10 includes an LED chip 11 and an auxiliary structure 12 having a lower mass density so as to reduce the overall mass density of the micro-component device 10. Specifically, the auxiliary structure 12 is disposed on the upper surface 111, and/or disposed along the edge surface 113 of the LED chip 11, and the mass density of the auxiliary structure 12 is specified to be smaller than the mass density of the LED chip 11. The auxiliary structure 12 can be made of an organic polymer material, for example an encapsulant packaging material, or a photoresist material, so that the mass density is significantly smaller than that of a material of the LED chip 11, such as at least about 1.5 times smaller, at least about 2 times smaller, or at least about 3 times smaller. For example, the mass density of the auxiliary structure 12 is about 1 g/cm$^3$, and the mass density of the material of the LED chip 11 (such as sapphire or gallium nitride) is about 4 g/cm$^3$ to about 6 g/cm$^3$.

Therefore, by providing the auxiliary structure 12 of a certain thickness (or width) and volume, the mass density of the overall micro-component device 10 can be greatly reduced, and thus more selections are available for the liquid suspending medium capable of floating the micro-component device 10. The greater the thickness (and the volume) of the auxiliary structure 12, the smaller the overall mass density of the micro-component devices 10. Therefore, the desired thickness of the auxiliary structure 12 is a design parameter to specify the desired overall mass density of the micro-component devices 10.

The auxiliary structure 12 can be directly formed on an LED wafer before it is singulated as a plurality of LED chips 11, by wafer-level spraying, spin coating or printing the organic polymer material on the upper surface 111 of the LED chip 11. Thereafter, a dicing process is performed to form the singulated LED chip 11 with the auxiliary structure 12 to form the desired micro-component device 10.

Figure 2D:
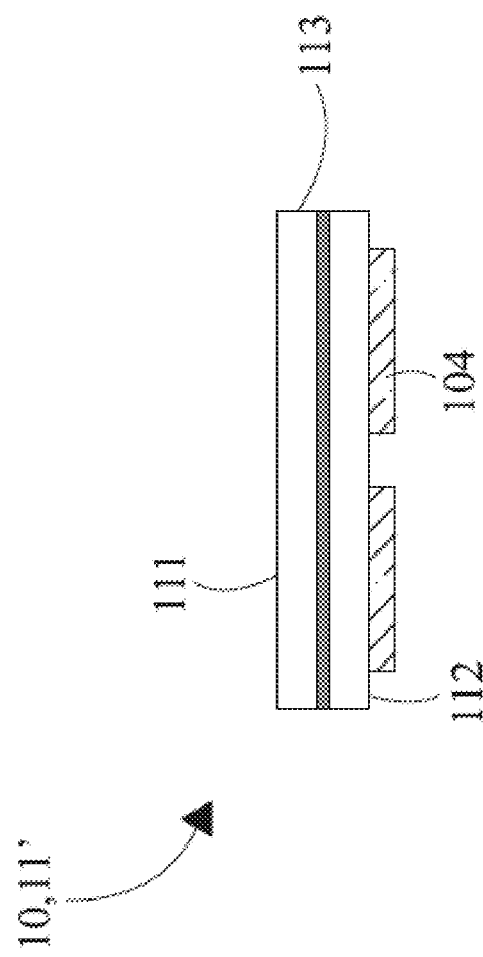
Figure 2E:
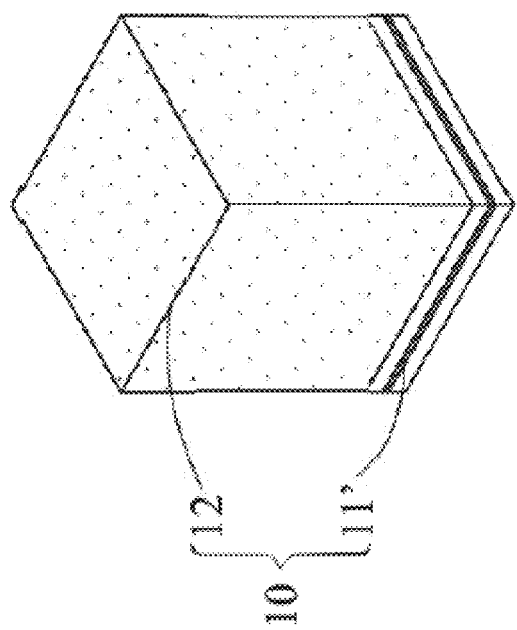

As illustrated in FIG. 2D is another embodiment, wherein the micro-component device 10 can be a thin-film LED chip 11', which is similar to the LED chip 11, but omits an epitaxial substrate such as sapphire. That is, the thickness of the LED chip 11' is smaller than a flip-chip LED chip. In another embodiment as illustrated in FIG. 2E, the micro-component device 10 includes a thin-film LED chip 11' and an auxiliary structure 12 disposed on the thin-film LED chip 11', where the auxiliary structure 12 serves to adjust and lower the overall mass density of the micro-component device 10.

The arrangement method S100 can be used to arrange various example embodiments of the micro-component device 10 including the above enumerated devices. It will be appreciated that the arrangement method S100 can be used to arrange other micro-component devices beyond the above example embodiments. In the following descriptions, the technical details of each process stage are further explained. Before implementing the mass arrangement technique according to some embodiments of the present disclosure, the micro-component devices 10 having relatively similar electrical and optical properties can be initially tested and sorted.

Figure 3B:
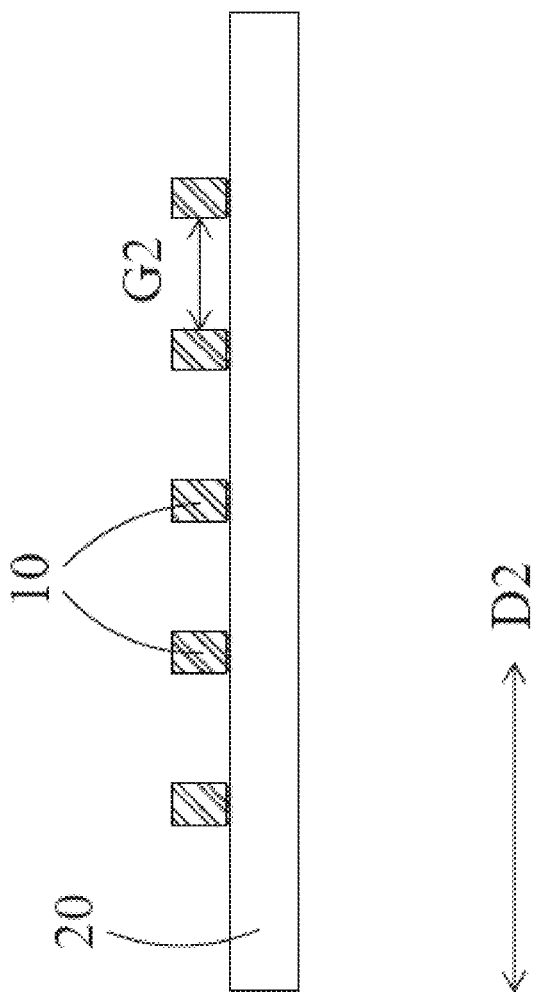

As illustrated in FIG. 3A to FIG. 3C, process stage S101 (shown in FIG. 1) is first performed to arrange a plurality of micro-component devices 10 into a lower-precision (or lower-density) initial array having an initial density of the micro-component devices 10. Specifically, the micro-component devices 10 are disposed on a temporary carrier substrate 20, and the micro-component devices 10 can be, for example, adhered to the temporary carrier substrate 20, or adsorbed on the temporary carrier substrate 20. If by adsorption, the temporary carrier substrate 20 can have a plurality of suction holes (not shown) connected to a source of negative pressure (e.g., a vacuum pump) to create suction force to adhere the micro-component devices 10. On the temporary carrier substrate 20, the micro-component devices 10 are spaced apart from each other along a first direction $D_1$ by a first-direction initial gap $G_1$ and along a second direction $D_2$ by a second-direction initial gap $G_2$. The first direction $D_1$ and the second direction $D_2$ are horizontal directions, and are transverse to each other (e.g., substantially perpendicular) and are substantially perpendicular to a thickness (vertical) direction of the micro-component devices 10. The initial gaps $G_1$ and $G_2$ can be substantially the same or different.

The first-direction initial gap $G_1$ and the second-direction initial gap $G_2$ may be multiple times, for example, about 2 times, about 5 times, or about 10 times, of a target gap along the first direction and the second direction (e.g., a first-direction target gap $G_1'$ and a second-direction target gap $G_2'$ described later) specified for a final arrangement of the micro-component devices 10. Therefore, the array formed by the first-direction initial gap $G_1$ and the second-direction initial gap $G_2$ of the micro-component devices 10 has a lower array density. In addition, when the micro-component devices 10 are arranged, it is not necessary to precisely control the initial gaps $G_1$ and $G_2$ between the micro-component devices 10. In other words, the initial gaps $G_1$ and $G_2$ allow a larger tolerance range between the micro-component devices 10 along the first direction $D_1$ and the second direction $D_2$. Furthermore, there is no stringent criterion for the orientation angle of the micro-component devices 10 for this lower-precision array. Therefore, the micro-component devices 10 can be arranged on the temporary carrier substrate 20 rapidly, and at lower cost (allowing omission of use of a higher precision instrument).

The micro-component devices 10 can be disposed one by one on the temporary carrier substrate 20, for example, by picking and placing. Alternatively, the micro-component devices 10 can be disposed on an adhesive film such as a blue tape and then moderately expanding the adhesive film to form a lower-density array of micro-component devices 10 with the first-direction initial gap $G_1$ and the second-direction initial gap $G_2$. Next, the lower-density array of micro-component devices 10 can be batch transferred to the temporary carrier substrate 20.

Figure 4A:
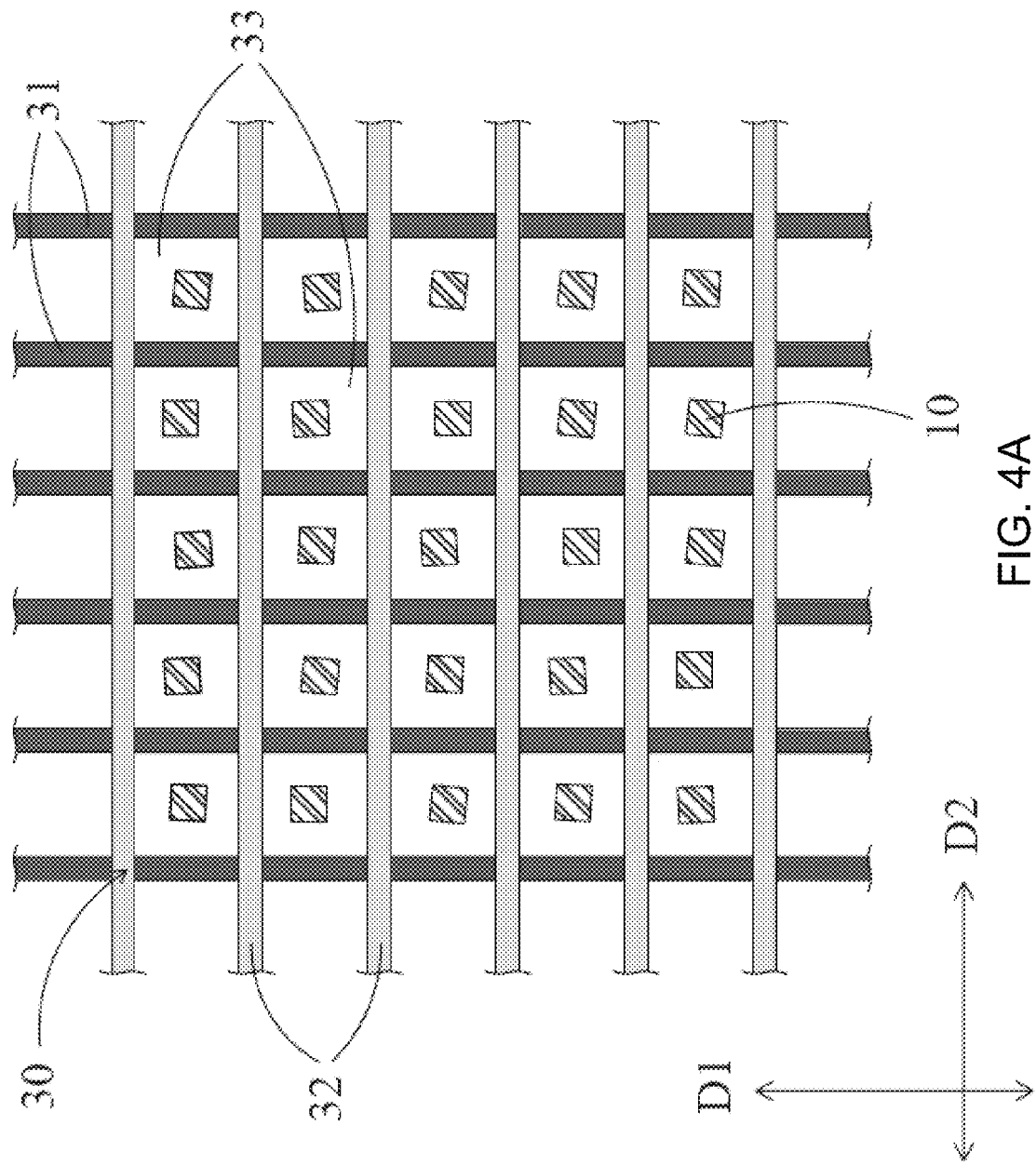

As illustrated from FIG. 4A to FIG. 4C, process stage S103 (shown in FIG. 1) is followed to provide a conductive wire assembly 30 surrounding the micro-component devices 10. Specifically, the conductive wire assembly 30 includes a plurality of first conductive wires 31 and a plurality of second conductive wires 32. The first conductive wires 31 extend substantially in parallel along the first direction $D_1$, and the second conductive wires 32 extend substantially in parallel along the second direction $D_2$. In other words, the first conductive wires 31 are substantially in parallel and are spaced apart along the second direction $D_2$, and the second conductive wires 32 are substantially in parallel and are spaced apart along the first direction $D_1$. In addition, the first conductive wires 31 are located above or below the second conductive wires 32, or the first conductive wires 31 may be intertwined with the second conductive wires 32. The first and the second conductive wires 31 and 32 can be disposed in an un-tensioned state, so they can move freely by attractive or repulsive forces.

By alternatively arranging the first conductive wires 31 and the second conductive wires 32, the conductive wire assembly 30 can define a plurality of grids (or grid openings) 33, each grid 33 being defined by and composed of two adjacent and substantially parallel first conductive wires 31 and two adjacent and substantially parallel second conductive wires 32. The dimensions of the grid 33 along the first direction $D_1$ and the second direction $D_2$ are $r_2$ and $r_1$, respectively, which may be the first direction initial gap $G_1$ and the second-direction initial gap $G_2$ between the micro-component devices 10 described above. $r_2$ and $r_1$ can be substantially the same or different.

The first and the second conductive wires 31 and 32 then surround the micro-component devices 10 such that the micro-component devices 10 are respectively located in respective ones of the grids 33. That is, the edge surfaces 113 of each of the micro-component devices 10 are adjacent to a pair of first conductive wires 31 and a pair of second conductive wires 32.

The first and the second conductive wires 31 and 32 can be energized with electricity to generate magnetic forces that attract each other; so each of the first and the second conductive wires 31 and 32 desirably comprises a core with high conductivity (e.g., gold, copper, aluminum, or another metal, or a superconductivity material) to generate a stronger magnetic field. In addition, each the first and the second conductive wires 31 and 32 further comprises an insulating coating covering the core to avoid short circuits between the first and the second conductive wires 31 and 32.

On the other hand, the wire diameters of the first and the second conductive wires 31 and 32 correspond to the second-direction target gap $G_2'$ and the first-direction target gap $G_1'$ specified for the final arrangement of the micro-component devices 10. Taking a 5.5-inch display with a resolution of 1920×1080 as an example, a sub-pixel size is about 63.4 μm×about 21.1 μm, and the target gap between the micro-component devices 10 is as small as about 0.01 mm to about 0.02 mm (or about 10 μm to about 20 μm). Therefore, the first and the second conductive wires 31 and 32 can be selected from those having a wire diameter of about 0.01 mm to about 0.02 mm. Conductive wires having a micrometer wire diameter, for example, can be obtained from, but not limited to, those conductive fiber manufacturers such as available under the trademark of GoodFellow® or the trademark of SWICOFIL®, or may be fabricated using a protrusion or a micro machining method. In addition, the first and the second conductive wires 31 and 32 may be selected with different wire diameters so that the micro-component devices 10 may have different pitches in the first direction and the second direction.

Both terminals of each of the first and the second conductive wires 31 and 32 can be electrically connected to a power supply 34 (as shown in FIG. 10), and the power supply 34 can provide a specific DC current (in Amperes) through the first and the second conductive wires 31 and 32 to generate a magnetic force. Specifically, the wire diameters of the first and the second conductive wires 31 and 32 determine a maximum DC current that the first and the second conductive wires 31 and 32 can sustain and therefore the magnetic force generated. The technical details will be further explained and illustrated in FIG. 6A to FIG. 6D.

Figure 5A:
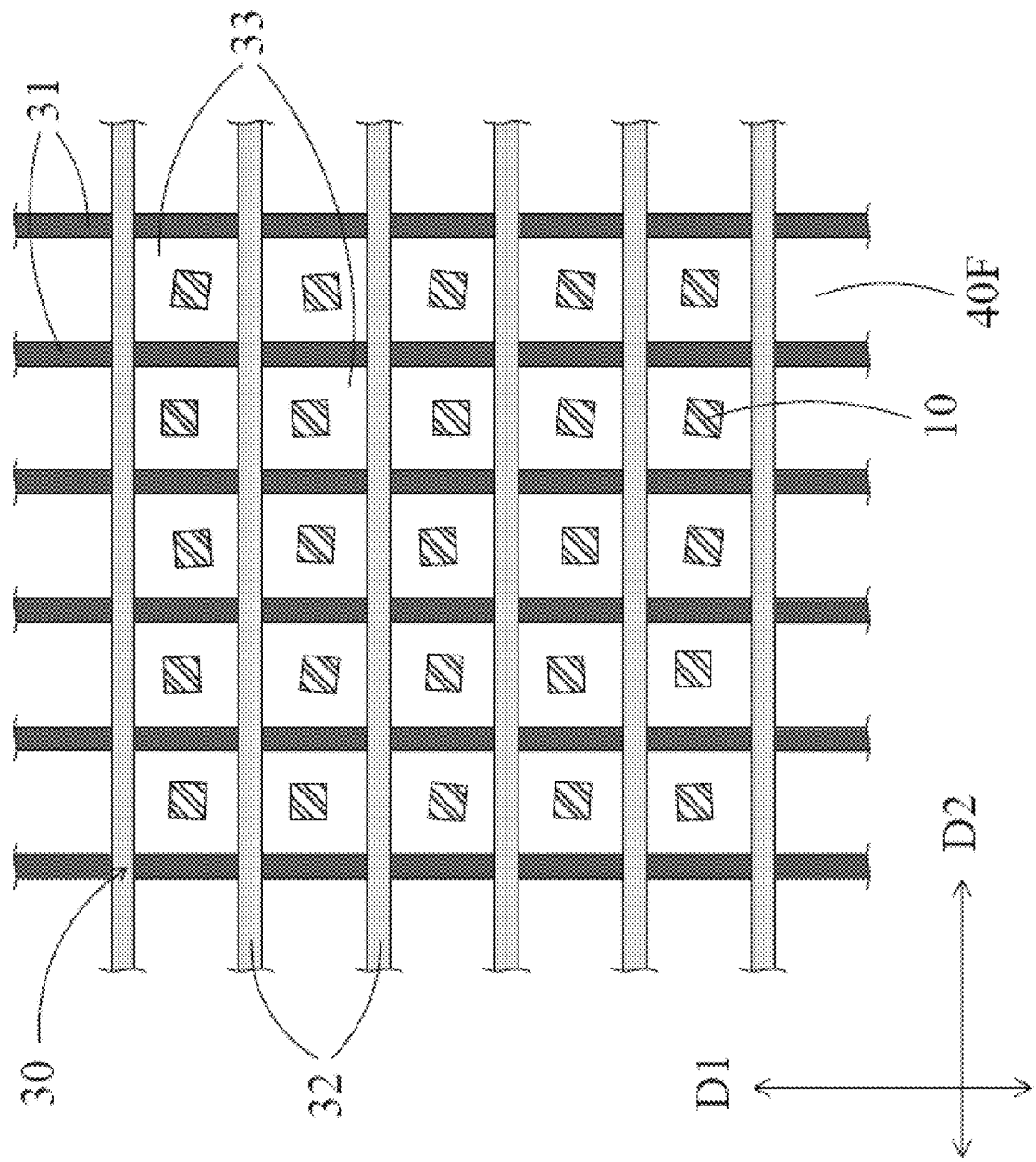
Figure 5B:
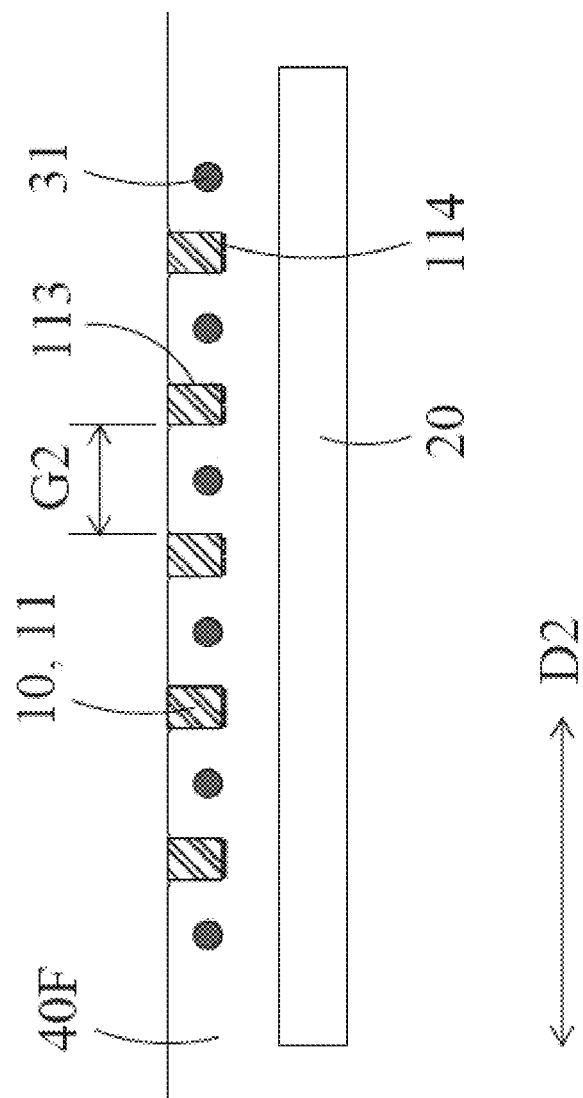
Figure 6A:
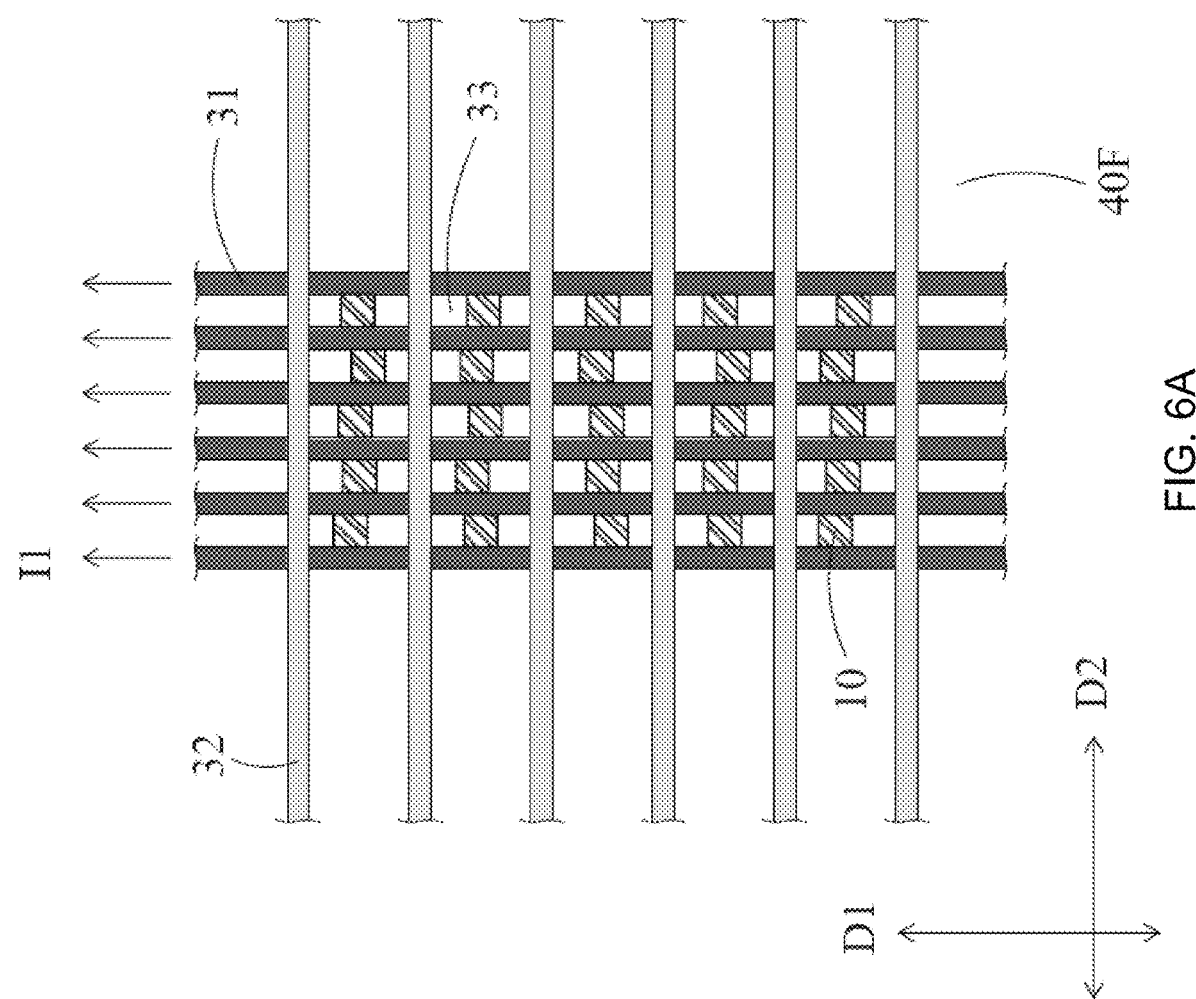

As illustrated from FIG. 5A to FIG. 5C, process stage S105 (shown in FIG. 1) is then performed to dispose the micro-component devices 10 to float on a surface of a liquid suspending medium 40F. Specifically, the micro-component devices 10 and the temporary carrier substrate 20 are placed in a container such as a liquid chamber 40 (as shown in FIG. 10), and then the liquid suspending medium 40F is injected into the liquid chamber 40 so that the liquid suspending medium 40F covers the temporary carrier substrate 20 (e.g., the temporary carrier substrate 20 is entirely immersed in the liquid suspending medium 40F) and contacts the edge surfaces 113 of the LED chips 11 of the micro-component devices 10. The liquid suspending medium 40F may also cover the upper surfaces 111 of the micro-component devices 10. After the liquid suspending medium 40F covers the temporary carrier substrate 20 and at least contacts the edge surfaces 113 of the LED chips 11, the injection of the liquid suspending medium 40F is stopped. At this time, the first and the second conductive wires 31 and 32 may also be covered by the liquid suspending medium 40F.

Next, the micro-component devices 10 are detached from the temporary carrier substrate 20 and floated in the liquid suspending medium 40F. That is, the micro-component devices 10 are temporarily attached to the temporary carrier substrate 20 by way of an adhesive or adsorption. If an adhesive method is used, it can be deactivated by heating or irradiating with ultraviolet light. If an adsorption method is used, it can be detached by stopping the operation of the negative pressure source, so that the adsorption is released. Therefore, the micro-component devices 10 are no longer attached to the temporary carrier substrate 20 and are free to move. At this time, since the mass density of the liquid suspending medium 40F is higher than the overall mass density of the micro-component devices 10, the liquid suspending medium 40F provides a buoyancy force to detach the micro-component devices 10 from the temporary carrier substrate 20 and float in the liquid suspending medium 40F. The floating micro-component devices 10 can be completely immersed in the liquid suspending medium 40F or partially exposed from the surface of the liquid suspending medium 40F. After the micro-component devices 10 are detached from the temporary carrier substrate 20, the temporary carrier substrate 20 is removed or can remain placed in the liquid suspending medium 40F. The vertical heights of the first and the second conductive wires 31 and 32 can be adjusted by the mechanism of the conductive wire assembly 30, or floated in the liquid suspending medium 40F, so that it is substantially in the same height relative to the floating micro-component devices 10.

The liquid suspending medium 40F having a higher mass density, for example, can be selected from, but not limited to, an electronic chemical liquid available under the trademark of Fluorinert™ (mass density of about 1.85 g/cm$^3$) available from 3M®, bromoform (CHBr$_3$, mass density of about 2.889 g/cm$^3$), di-iodomethane (CH$_2$I$_2$, mass density of about 3.325 g/cm$^3$) or iodoform (CHI$_3$, mass density about 4.008 g/cm$^3$).

Since the buoyancy of the liquid suspending medium 40F causes or mainly causes the micro-component devices 10 to move vertically up slightly, the micro-component devices 10 can freely move horizontally when subjected to a lateral force, and the buoyancy should not cause the micro-component devices 10 to greatly traverse in the first direction $D_1$ and the second direction $D_2$. Therefore, the floating micro-component devices 10 can still be spaced apart from each other while preserving the first-direction initial gap $G_1$ and the second-direction initial gap $G_2$ in a form of an array. In addition, desirably, the mass density of the liquid suspending medium 40F is slightly higher than the mass density of the micro-component devices 10 (e.g., up to about 1.5 times higher, up to about 1.4 times higher, or up to about 1.3 times higher) so that the micro-component devices 10 can be gently moved up and detached from the temporary carrier substrate 20 to reduce the fluctuation of the liquid suspending medium 40F during the upward motion of the micro-component devices 10. Furthermore, if each micro-component device 10 includes the auxiliary structure 12 disposed on the upper surface 111, since the mass density of the auxiliary structure 12 is specified to be smaller than the mass density of the LED chip 11, during the upward movement, the auxiliary structure 12 tends to stay upward and the set of electrodes 114 of the LED chip 11 tends to stay downward to form a stable state in the liquid suspending medium 40F.

In the present embodiment, after the micro-component devices 10 are disposed and located in the grids 33 of the conductive wire assembly 30, the liquid suspending medium 40F is then injected to float the micro-component devices 10. In other embodiments, the liquid suspending medium 40F may be first injected to float the micro-component device 10, and then the conductive wire assembly 30 is provided to surround the micro-component devices 10. Therefore, the sequence of process stages S103 and S105 can be switched in order.

As illustrated from FIG. 6A to FIG. 6E, an electromagnetic force is generated on the conductive wire assembly 30 to perform process stage S107 (as shown in FIG. 1) to actuate the floating micro-component devices 10 to move closer to form a higher-precision (or higher density) target array having a higher target density of the micro-component devices 10. Specifically, as shown from FIG. 6A to FIG. 6C, a DC current $I_1$ is applied to the first conductive wires 31 along the first direction $D_1$ to generate a magnetic field on each of the first conductive wires 31. The DC current $I_1$ of each of the first conductive wire 31 is substantially in the same direction, so that the generated magnetic fields are also substantially in the same direction. By Ampère's force law, the first conductive wires 31 are attracted to each other and actuated to move closer along the second direction $D_2$. Consequently, the size $r_1$ of the grids 33 is also reduced. As such, the first conductive wires 31 will actuate the micro-component devices 10 against the edge surfaces 113 of the micro-component devices 10 such that the micro-component devices 10 also move closer along the second direction $D_2$.

As shown from FIG. 6D and FIG. 6E, a DC current $I_2$ is applied to the second conductive wires 32 along the second direction $D_2$ to generate another magnetic field, and the second conductive wires 32 are attracted to each other along the first direction $D_1$. Therefore, the second conductive wires 32 are moved closer along the first direction $D_1$, and the size $r_2$ of the grids 33 is also reduced. As such, the second conductive wires 32 will actuate the micro-component devices 10 closer together along the first direction $D_1$. The applied DC current on the second conductive wires 32 may be performed simultaneously with the applied DC current on the first conductive wires 31 or sequentially.

For example, by applying DC currents $I_1$ and $I_2$ to the first and the second conductive wires 31 and 32, the micro-component devices 10 can be actuated along the second direction $D_2$ and along the first direction $D_1$ due to electromagnetic attraction. Due to contraction in size of the grids 33, an array of a higher density is thereby formed and arranged with a first-direction target gap $G_1'$ and a second-direction target gap $G_2'$. The first-direction target gap $G_1'$ and the second-direction target gap $G_2'$ are smaller than the corresponding first-direction initial gap $G_1$ and the corresponding second-direction initial gap $G_2$. Furthermore, the first-direction target gap $G_1'$ corresponds to the wire diameter of the second conductive wires 32 and the second-direction target gap $G_2'$ corresponds to the wire diameter of the first conductive wires 31, wherein the first conductive wires 31 and the second conductive wires 32 may have substantially the same or different wire diameters. The size of the grids 33 defined by the first and the second conductive wires 31 and 32 after contraction in size may be substantially the same or slightly larger than the size of the upper surface 111 of each micro-component device 10. Because the first conductive wires 31 are substantially perpendicular to the second conductive wires 32, the orientation of the micro-component devices 10 formed as a higher-precision array can be controlled within ±10 degrees, ±5 degrees, or ±1 degree.

According to Ampère's force law:

$$\frac{F}{\Delta L} = \frac{\mu_0 I_1 I_2}{2\pi r},$$

the electromagnetic force F generated by two adjacent and parallel current-carrying conductive wires (e.g., the first conductive wires 31 or the second conductive wires 32) can be calculated, wherein: $I_1$ and $I_2$ are the DC currents of the two parallel current-carrying conductive wires, $\Delta L$ is the length of the current-carrying conductive wires, r is the distance between the two current-carrying conductive wires, and to is the vacuum permeability.

The electromagnetic force $F_1$ and $F_2$ generated by the first conductive wires 31 and the second conductive wires 32 will be described below by taking a 5.5" display size with a resolution of 1920×1080 as an example.

As shown in FIG. 4A, the floating micro-component devices 10 are first arranged as a lower-density array with the first-direction initial gap $G_1$ and the second-direction initial gap $G_2$ (having an array size of about 151.1 mm×about 268.7 mm). The center distance $r_2$ between the adjacent first conductive wires 31 and the center distance $r_1$ between the adjacent second conductive wires 32 are set to about 139 μm. The wire diameter of the first conductive wire 31 and the second conductive wire 32 made of copper is selected to be about 20.3 μm. Therefore, the first conductive wires 31 and the second conductive wires 32 with about 20 μm in wire diameter have a burn-out current of about 460 mA. As shown in FIG. 6D, the DC currents $I_1$ and $I_2$ are set to about 350 mA, which does not exceed the burn-out current; and the micro-component devices 10 are actuated to move closer and arranged in a higher array density with the first-direction target gap $G_1'$ and the second-direction target gap $G_2'$. This arranged array has an array size of about 68.5 mm×about 121.8 mm, and the center distance $r_1$ and $r_2$ are reduced from about 139 μm to about 63 μm.

The above values are summarized in the Table 1. According to Ampère's law, the electromagnetic force $F_1$ of the first conductive wires 31 is about 0.0027 g, and the electromagnetic force $F_2$ of the second conductive wires 32 is about 0.0048 g.

TABLE 1

| | Lower-density Array | Higher-density Array | Unit |
|---|---|---|---|
| $I_1$ | 0.35 | 0.35 | A |
| $I_2$ | 0.35 | 0.35 | A |
| $r_2$ (center distance between the first conductive wires 31) | 0.000139 | 0.000063 | m |
| $r_1$ (center distance between the second conductive wires 32) | 0.000139 | 0.000063 | m |
| $\mu_0$ | 1.2566E−06 | 1.2566E−06 | N/A$_2$ |
| $\Delta L_1$ (Array Width) | 0.1511 | 0.0685 | m |
| $\Delta L_2$ (Array Length) | 0.2687 | 0.1218 | m |
| $F_1/\Delta L_1$ (Width) | 1.76259E−04 | 3.88889E−04 | N/m |
| $F_2/\Delta L_2$ (Length) | 1.76259E−04 | 3.88889E−04 | N/m |
| $F_1$ (Width) | 2.71717E−03 | * | g |
| $F_2$ (Length) | 4.83140E−03 | * | g |

The electromagnetic force $F_1$ is generated between a first one and an adjacent second one of the conductive wires 31, and also generated between the first one and a third one of the conductive wires 31, and also generated between the first one and a fourth one of the conductive wires 31, and so forth. Therefore, as shown in Table 2, when the electromagnetic force is generated by one hundred current-carrying ones of the first conductive wires 31, the total accumulated electromagnetic force $F_1$ is about 5.19 times of that generated between two adjacent ones of the first conductive wires 31. That is, the total accumulated electromagnetic force $F_1$ is about 0.0141 g. Similarly, when the electromagnetic force is generated by one hundred current-carrying ones of the second conductive wires 32, the total accumulated electromagnetic force $F_2$ is about 5.19 times of that generated between two adjacent ones of the second conductive wires 32. That is, the total accumulated electromagnetic force $F_2$ is about 0.0251 g. Therefore, the electromagnetic forces $F_1$ and $F_2$ of the first conductive wires 31 and the second conductive wires 32 are sufficient to actuate the floating micro-component devices 10 to be moving closer to each other to form a higher-precision arranged array.

TABLE 2

| No. of current-carrying first conductive wires 31 | Normalized electromagnetic force $F_1$ of the No. of the first conductive wires 31 relative to a pair of adjacent conductive wire 31 (%) | Accumulated Electromagnetic Force |
| --- | --- | --- |
| 1 | 100 | 1 |
| 2 | 50 | 1.5 |
| 3 | 33 | 1.8333 |
| 4 | 25 | 2.08333 |
| 5 | 20 | 2.2833 |
| 10 | 10 | 2.9290 |
| 20 | 5 | 3.5977 |
| 30 | 3.3 | 3.9950 |
| 50 | 2.0 | 4.4992 |
| 100 | 1.0 | 5.1874 |

Figure 7A:
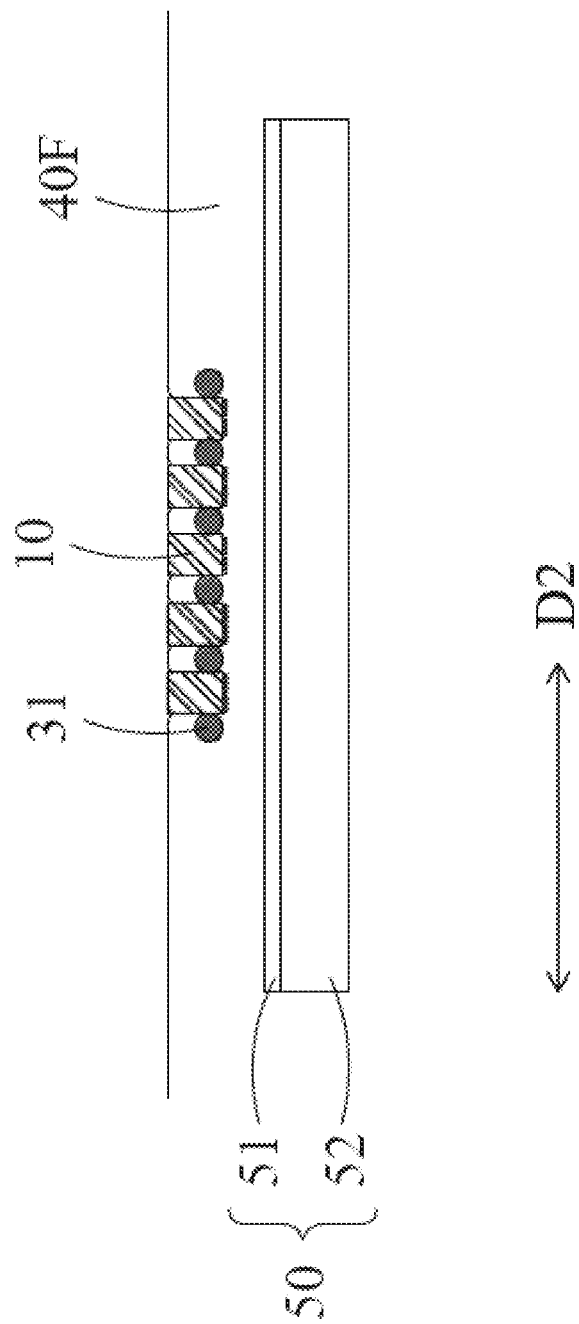
FIG. 7A and FIG. 7B are schematic diagrams showing process stages of transferring micro-component devices onto a carrier substrate, wherein the process stages can be part of the method of arranging the micro-component devices illustrated in FIG. 1.
Figure 7B:
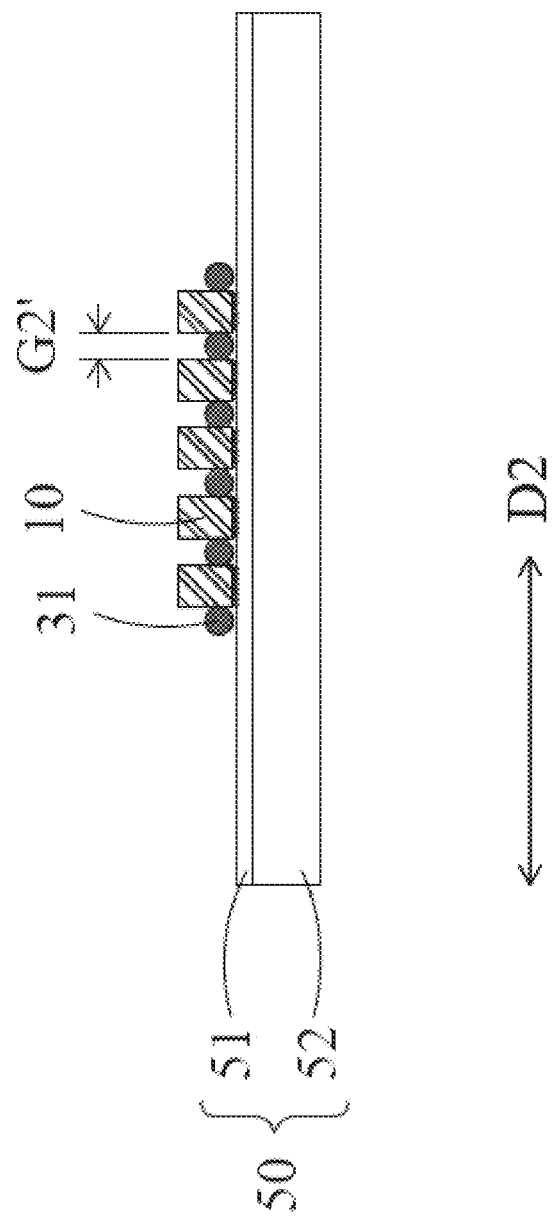

As illustrated in FIG. 7A and FIG. 7B, process stage S109 (shown in FIG. 1) is followed by transferring the arranged array of the micro-component devices 10 onto a carrier substrate 50. Specifically, as shown in FIG. 7A, the carrier substrate 50 is disposed in the liquid suspending medium 40F and under the micro-component devices 10. The carrier substrate 50 can be embodied as a plate 52 with an adhesive film 51, or an adhesive film 51 alone. As shown in FIG. 7B, the liquid suspending medium 40F is then drained to lower the micro-component devices 10 to settle on and contact the carrier substrate 50, and the micro-component devices 10 can be pressure-bonded to the carrier substrate 50 from above using a pressing plate (not shown). During the transfer process, the first conductive wires 31 and the second conductive wires 32 are in a contraction state due to attraction force among wires 31 and 32 generated by the DC currents, and the micro-component devices 10 are still arranged at a high array density with the specified first-direction target gap $G_1'$ and the specified second-direction target gap $G_2'$.

In another embodiment (not shown), after the carrier substrate 50 is disposed in the liquid suspending medium 40F, the carrier substrate 50 can be actuated to move upward so that the adhesive film 51 of the carrier substrate 50 is in contact with the set of electrodes 114 of the micro-component devices 10. The carrier substrate 50 can continue to move up and leave the liquid suspending medium 40F with the micro-component devices 10. In this process, draining of the liquid suspending medium 40F may be omitted. In yet another embodiment (not shown), the first conductive wires 31 and the second conductive wires 32 of the conductive wire assembly 30 are actuated to move upward in the contraction state together with the micro-component devices 10 and leave the liquid suspending medium 40F. Then the micro-component devices 10 are placed on the carrier substrate 50. In this process, draining of the liquid suspending medium 40F may be omitted, and the carrier substrate 50 does not need to be disposed in the liquid suspending medium 40F.

Figure 8A:
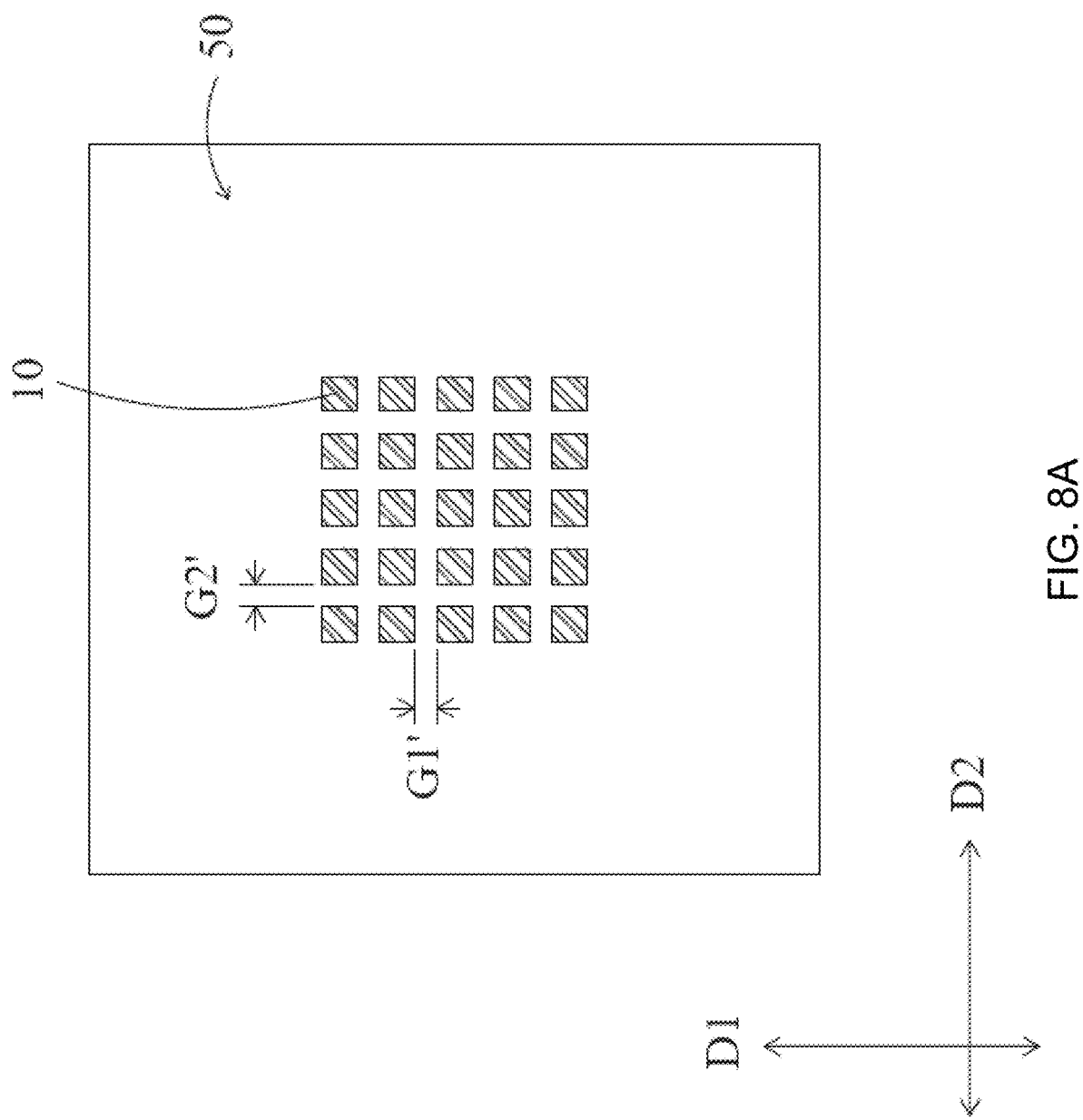
FIG. 8A and FIG. 8B are schematic diagrams showing process stages of removing a conductive wire assembly, wherein the process stages can be part of the method of arranging the micro-component devices illustrated in FIG. 1.
Figure 8B:
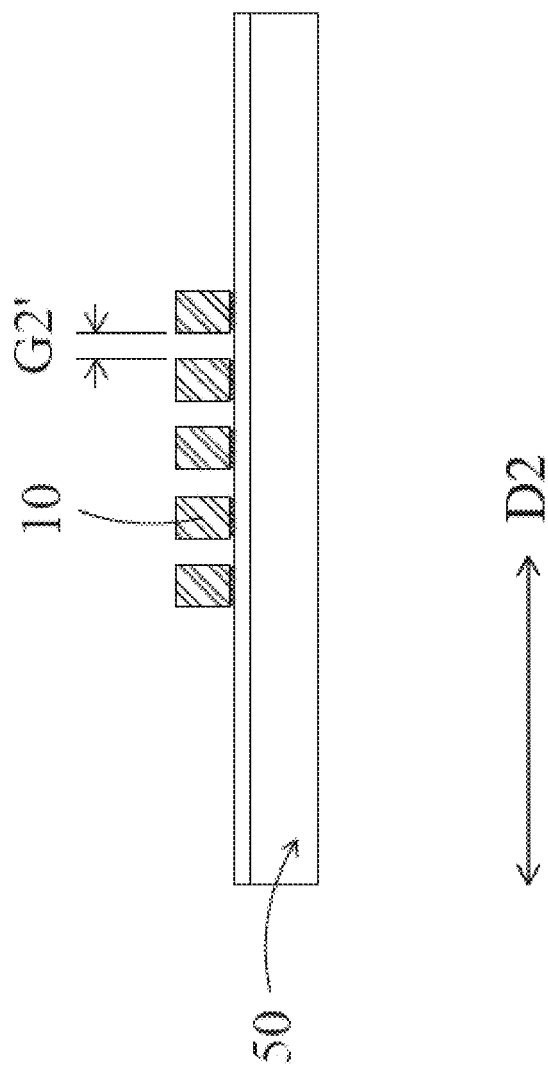

As illustrated in FIG. 8A and FIG. 8B, the last process stage S111 (shown in FIG. 1) is performed to remove the first conductive wires 31 and the second conductive wires 32 of the conductive wire assembly 30. Specifically, the DC currents are ceased to be applied to the first conductive wires 31 and the second conductive wires 32, and then the first conductive wires 31 and the second conductive wires 32 are actuated to move upward and leave (no longer surrounding) the micro-component devices 10. Thereafter, if the micro-component devices 10 includes the auxiliary structures 12, the auxiliary structures 12 can be removed (e.g., removed by process techniques such as photoresist stripping by etching or ashing) such that the LED chips 11 remain. In this way, a precisely arranged array of LED chips 11 with a specified target gap can be completed.

The arranged array of the LED chips 11 (or micro-component devices 10) on the carrier substrate 50 can then be subsequently transferred to another application circuit board (not shown) comprising a driving circuit by a mass transfer technique. As shown in FIG. 7A to FIG. 7B, an application circuit board can also be directly used as the carrier substrate 50. Therefore, the micro-component devices 10 are directly disposed on the application circuit board while omitting another mass transfer process.

Figure 9A:
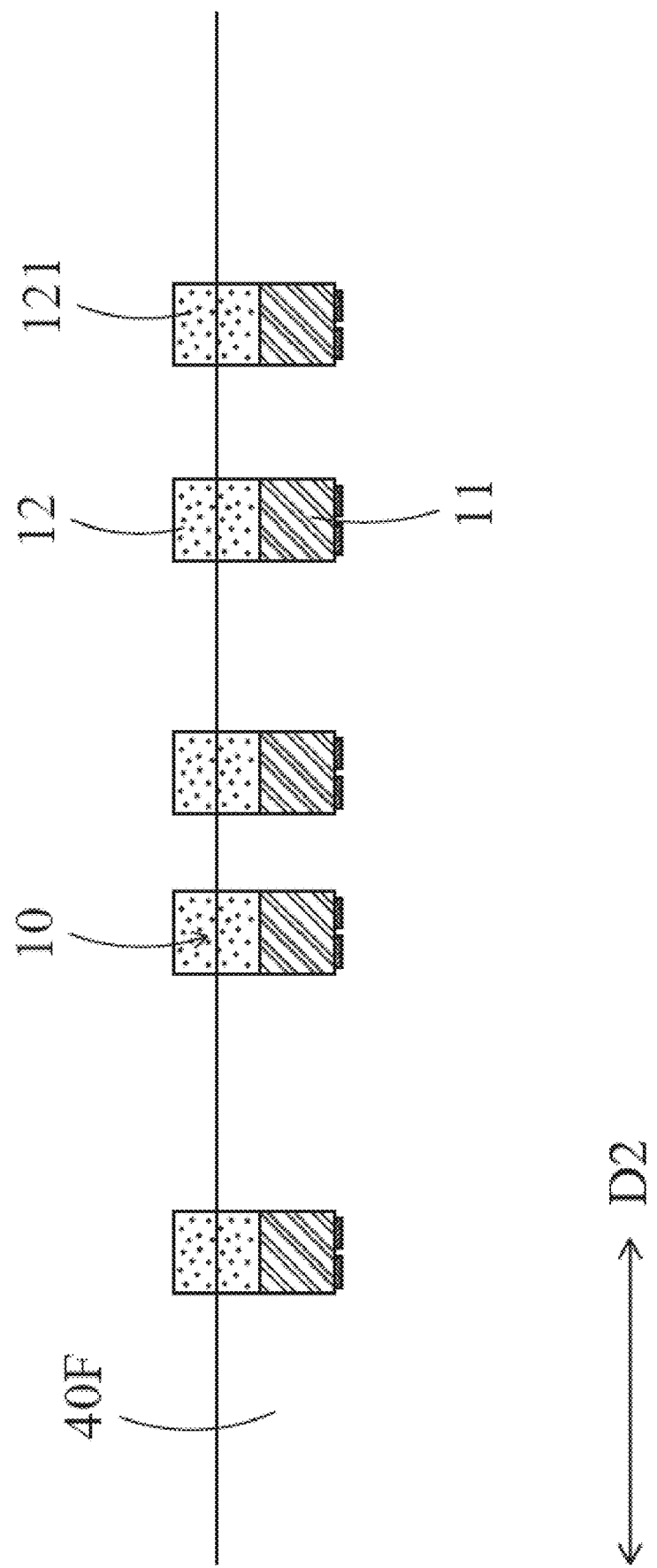
FIG. 9A, FIG. 9B, FIG. 9C, and FIG. 9D are schematic diagrams showing process stages of a method of arranging a plurality of micro-component devices according to another embodiment of the present disclosure, wherein the schematic diagrams illustrate the process stages of arranging the micro-component devices as a lower-density array.
Figure 9B:
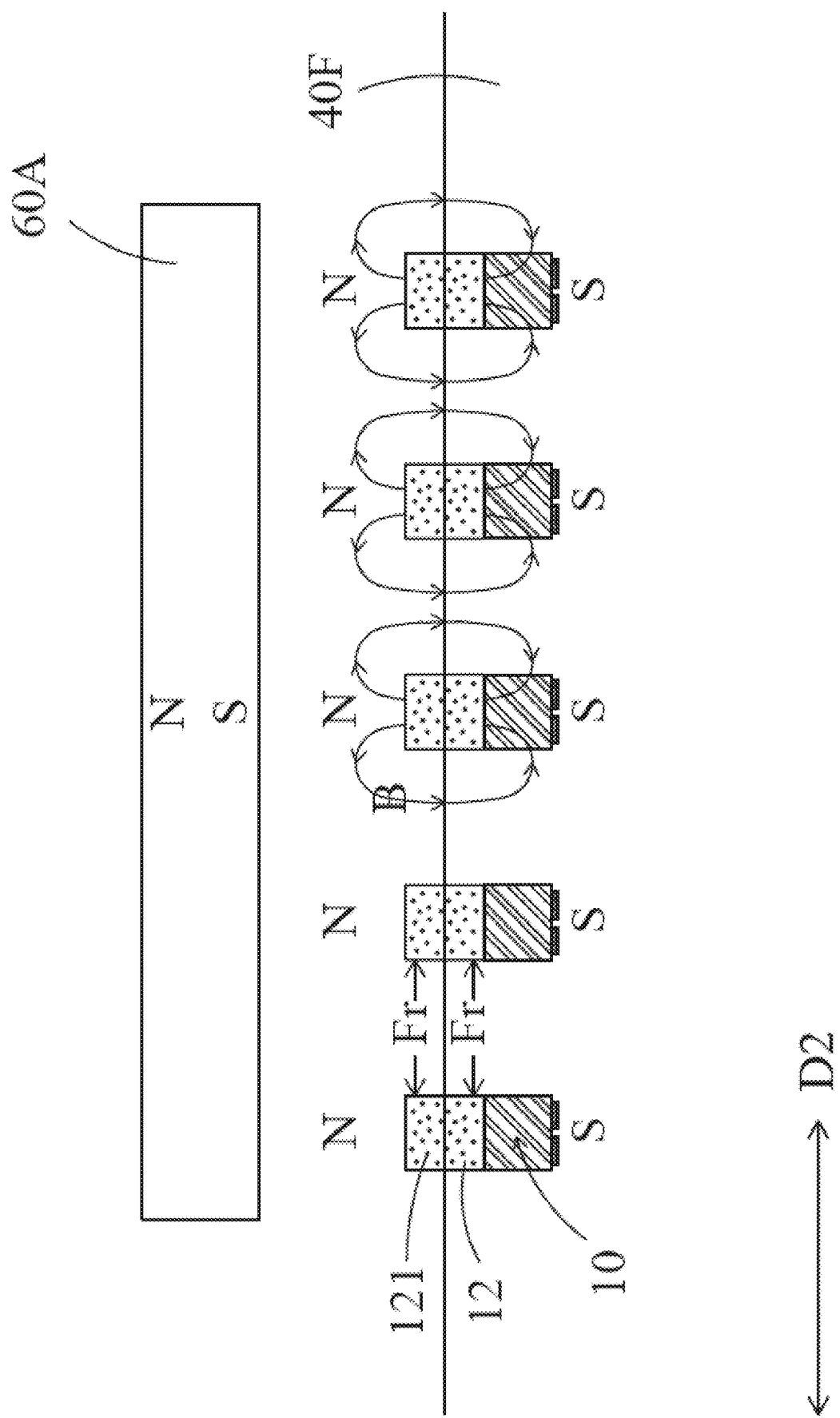
Figure 9C:
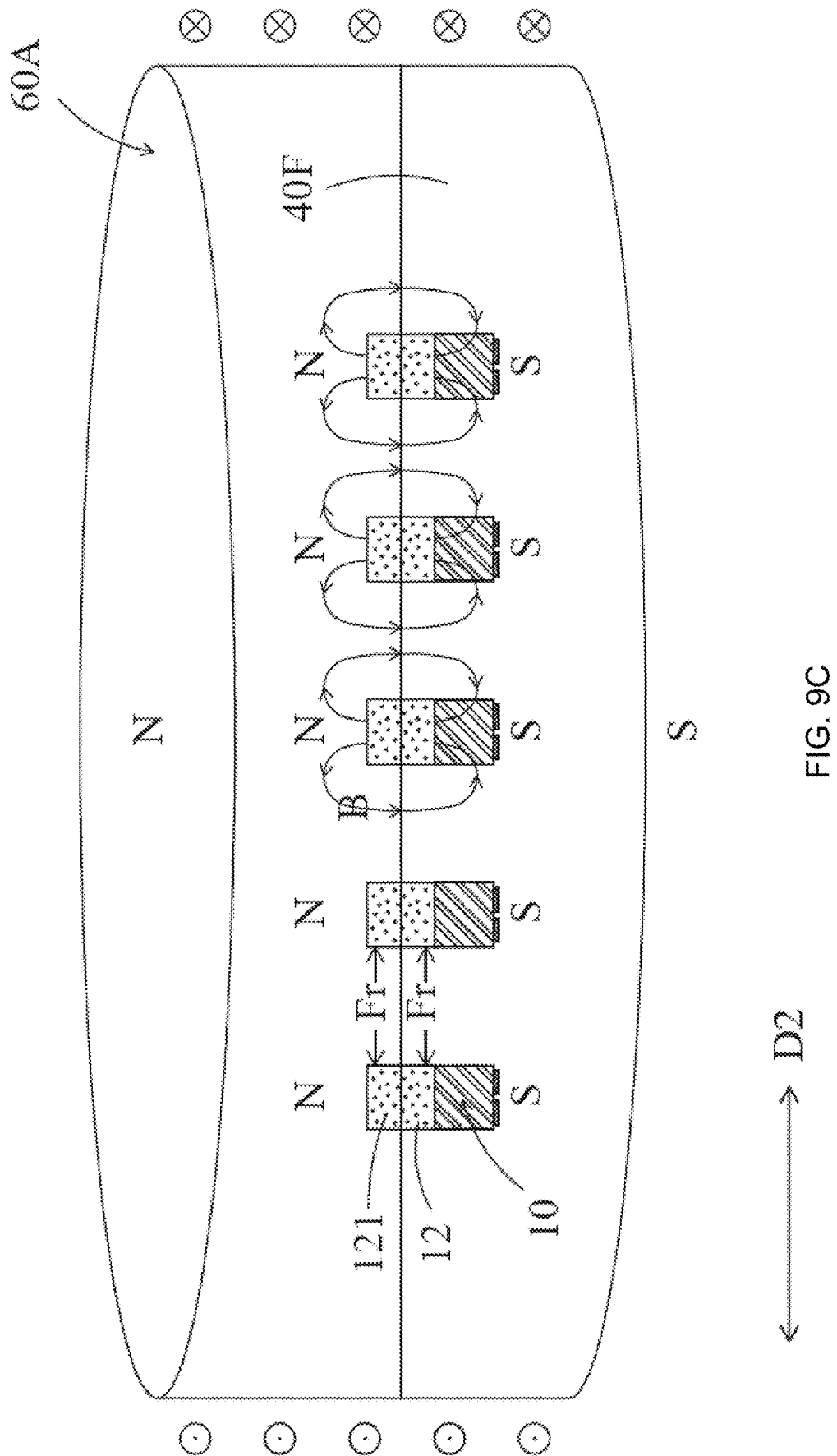

As illustrated from FIG. 9A to FIG. 9C, another embodiment of a micro-component device arrangement method is disclosed according to the present disclosure, and the technical details thereof can be referred to, understood or combined with the technical details of the arrangement method S100 described above. This arrangement method is similar to the arrangement method S100 and includes the same process stages S107 to S111. However, when the micro-component devices 10 are formed as a lower-precision array, alternative process stages can be adopted and the technical details can be explained in the following.

As shown in FIG. 9A, a liquid suspending medium 40F having a higher mass density is prepared, and then a plurality of micro-component devices 10 are floated on the liquid suspending medium 40F. That is, the micro-component devices 10 are directly placed in the liquid suspending medium 40F for suspension, and use of a temporary carrier substrate 20 is omitted. Further, when the micro-component devices 10 are disposed in the liquid suspending medium 40F, the orientation of and the gaps among the micro-component devices 10 are not specifically set. That is, the micro-component devices 10 floating thereon may be disorderly distributed and irregularly arranged.

Each micro-component device 10 includes the auxiliary structure 12 having a lower mass density, and the auxiliary structure 12 further includes a magnetic material mixed in a photoresist material. The magnetic material 121 may include, for example, iron, cobalt, nickel, an alloy thereof or a compound thereof, so that the auxiliary structure 12 can generate a magnetic force while exposed to a magnetic field. Desirably, the magnetic material 121 may be a soft magnetic material that is prone to be magnetized and de-magnetized, and a magnetic field may be imposed to align the magnetic moments of the magnetic material 121 to generate magnetism. When the magnetic field is removed, the magnetic moment of the magnetic material 121 resumes to a disorderly arrangement without magnetism.

As shown in FIG. 9B, when the micro-component devices 10 are floated on the surface of the liquid suspending medium 40F, a magnetic field is applied to the micro-component devices 10. A magnetic field generator 60A, which can include a permanent magnet or an electromagnet, is used to generate a specified magnetic field, and can be disposed above the micro-component devices 10. Alternatively, as shown in FIG. 9C, the magnetic field generator 60A can also be configured to surround the micro-component devices 10. The magnetic field provided by the magnetic field generator 60A can induce the magnetic material of the auxiliary structure 12 to generate a magnetic field B. That is, each of the micro-component devices 10 induces a respective magnetic field B with substantially the same polarity; for example, the north pole N is facing upward and the south pole S is facing down. In other words, each of the micro-component devices 10 becomes a small magnet with substantially the same polarity.

Since the micro-component devices 10 have magnetic fields B of substantially the same polarity, a repulsive force Fr will be generated between the micro-component devices 10 such that the micro-component devices 10 are actuated to move along the first direction $D_1$ and/or the second direction $D_2$. After the micro-component devices 10 have reached an equilibrium state under the action of the mutual repulsive force Fr, the micro-component devices 10 may be arranged with the first-direction initial gap $G_1$ along the first direction $D_1$ and arranged with the second-direction initial gap $G_2$ along the second direction $D_2$. A lower-precision array such as shown in FIG. 5A is formed accordingly.

Figure 9D:
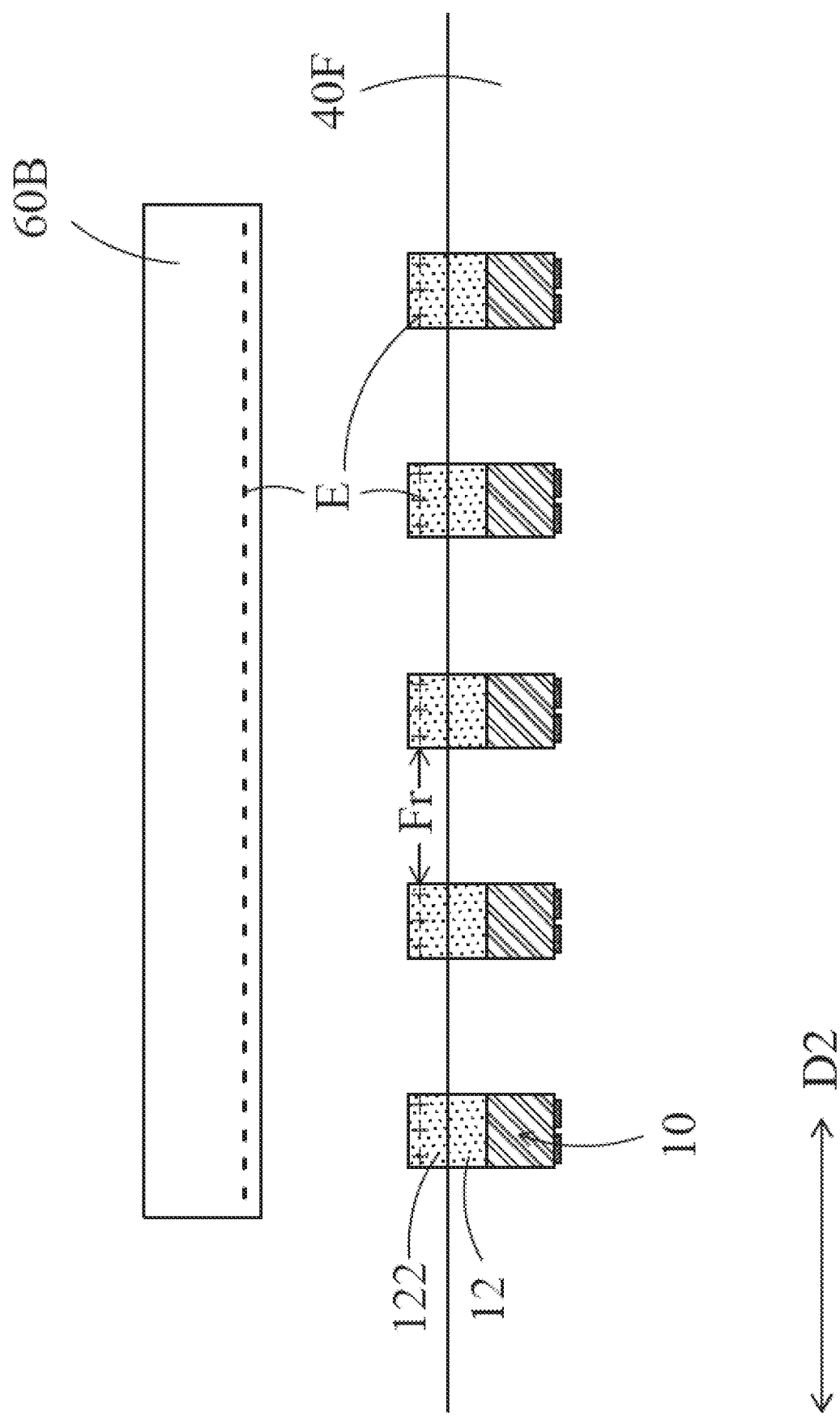

As shown in FIG. 9D, in another embodiment, the auxiliary structure 12 may not include the magnetic material 121, but may include a material that is prone to be induced by an electric field to generate electrostatic charges, or contains an electrostatic induction material 122 that is mixed in the auxiliary structure 12. After the micro-component devices 10 are disposed floating on the surface of the liquid suspending medium 40F, an electric field generator 60B can be used to generate an electric field acting on the micro-component devices 10. The electric field generator 60B carries or generates electrostatic charges E (e.g., a negative charge as illustrated in FIG. 9D), and can be disposed above and/or below the micro-component devices 10.

After the electric field is applied, the electrostatic induction material 122 inside the auxiliary structure 12 generates opposite electrostatic charges E (for example, positive charges) by electrostatic induction, so that the electrostatic charges E will be attracted proximal to the electric field generator 60B. Since the auxiliary structure 12 has a local electric field generated by the induced charges E, a mutual repulsive force Fr is generated among the micro-component devices 10, actuating the micro-component devices 10 to move along the first direction $D_1$ and/or along the second direction $D_2$. After the micro-component devices 10 have reached an equilibrium state under the action of the mutual repulsive force Fr, the micro-component devices 10 may be arranged with the first-direction initial gap $G_1$ along the first direction $D_1$ and arranged with the second-direction initial gap $G_2$ along the second direction $D_2$. A lower-precision array such as shown in FIG. 5A is formed accordingly.

After the floating micro-component devices 10 are arranged into a lower-precision array under the action of the mutual repulsive force Fr, the process stages of providing the conductive wire assembly (e.g., the above process stages S103 to S111) can be used to continue the arrangement method. Further, when the process stage S103 of providing the conductive wire assembly is performed, simultaneously, an additional electric or magnetic field is applied acting on the micro-component devices 10 until the micro-component devices 10 are actuated to move inside the grids 33 of the conductive wire assembly 30 (as shown in FIG. 4A).

Furthermore, by adjusting the magnitude of the applied electric or magnetic field, and thereby controlling the distribution of the mutual repulsive force Fr among the micro-component devices 10, the micro-component devices 10 can be directly arranged to be spaced apart with the target gaps $G_1{'}$ and $G_2{'}$. Thus, the execution of the process stages such as S103: providing the conductive wire assembly 30, and S107: actuating the micro-component devices 10 to move closer can be omitted.

As illustrated in FIG. 10, a micro-component device arrangement system 100D according to an embodiment of the present disclosure, which can be used to perform at least certain process stages of the micro-component device arrangement method S100, will be described. Therefore, for the sake of brevity, the technical description of the micro-component device arrangement system 100D can refer to the technical details of the above-mentioned micro-component device arrangement method S100 (or vice versa).

The micro-component device arrangement system 100D at least includes a liquid chamber module 400D, a micro-component device arrangement module 300D, a magnetic field generator 60A (and/or an electric field generator 60B), and a control module 70. The liquid chamber module 400D can include a liquid chamber 40 that can accommodate the liquid suspending medium 40F. The micro-component devices 10 and the temporary carrier substrate 20 (not shown) can be placed in the liquid chamber 40, and the micro-component devices 10 can be disposed to float on the liquid suspending medium 40F (as shown in FIG. 5A).

Optionally, the liquid chamber module 400D further includes a first valve 41 and a second valve 42, which may be directly connected to the liquid chamber 40 or indirectly connected to the liquid chamber 40 through a pipeline. When the second valve 42 is opened, the liquid suspending medium 40F can be continuously injected into the liquid chamber 40, so that the liquid suspending medium 40F covers the micro-component devices 10 and/or the temporary carrier substrate 20. When the first valve 41 is opened, the liquid suspending medium 40F can be drained from the liquid chamber 40 so that the micro-component devices 10 are lowered and contact the carrier substrate 50 (as shown in FIG. 7B). The liquid chamber module 400D further includes a liquid level sensor 43 for sensing the liquid level of the liquid suspending medium 40F, so that the control module 70 can utilize the liquid level to coordinate the opening or closing of the first valve 41 and the second valve 42.

The micro-component device arrangement module 300D includes a conductive wire assembly 30 and a power supply 34. The conductive wire assembly 30 includes a plurality of first conductive wires 31 and a plurality of second conductive wires 32 (as shown in FIG. 4A), wherein both the first conductive wires 31 and the second conductive wires 32 are disposed in the liquid chamber 40. The conductive wire assembly 30 can be actuated to move in the liquid chamber 40, and after the micro-component devices 10 are disposed to float on the liquid suspending medium 40F, the conductive wire assembly 30 is actuated to surround the micro-component devices 10. The conductive wire assembly 30 can also be removed from the liquid chamber 40. The power supply 34 is electrically connected to the conductive wire assembly 30 to supply DC currents to the first conductive wires 31 and the second conductive wires 32 to actuate the first conductive wires 31 and the second conductive wires 32 by generating attractive electromagnetic fields. The power supply 34 is connected to both terminals of each of the first conductive wires 31 and the second conductive wires 32.

The magnetic field generator 60A and/or the electric field generator 60B (as shown in FIG. 9C and/or FIG. 9D) can generate a uniform magnetic field and/or a uniform electric field in the liquid chamber 40, creating a mutual repulsive force Fr among the micro-component devices 10. The power supply 34 can be electrically connected to the magnetic field generator 60A and/or the electric field generator 60B to supply DC currents to generate a magnetic field and/or an electric field. The magnetic field generator 60A and/or the electric field generator 60B may be disposed in the liquid chamber 40, but not in contact with the liquid suspending medium 40F; or can be disposed outside the liquid chamber 40, for example, above or below the liquid chamber 40 or surrounding the liquid chamber 40.

The control module 70 is connected to and is configured to control and coordinate the operation of the liquid chamber module 400D and the micro-component device arrangement module 300D, thereby automatically performing the micro-component device arrangement method. For example, the control module 70 can control the opening and closing of the first valve 41 and the second valve 42, control the power supply 34 to supply DC currents to the conductive wire assembly 30, the magnetic field generator 60A and/or the electric field generator 60B, and so forth. The control module 70 can include a programmable logic controller, a microprocessor and an associated memory storing executable instructions, and so forth.

Accordingly, the system and the method for arranging micro-component devices according to some embodiments of the present disclosure can arrange the micro-component devices and form an array rapidly, conveniently, and accurately, so that subsequent processes such as mass transfer of the micro-component devices can be performed. The micro-component devices can also be arranged directly on an application circuit board to allow omission of another mass transfer process.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, or process to the objective, spirit and scope of the disclosure. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not limitations of the disclosure.

What is claimed is:

1. A method of arranging micro-component devices, comprising:
   disposing a plurality of micro-component devices to float on a liquid suspending medium, wherein the micro-component devices are spaced apart along a first direction by a first-direction initial gap and along a second direction by a second-direction initial gap, and the first direction is transverse to the second direction;
   actuating the micro-component devices floating on the liquid suspending medium to move closer to each other such that the micro-component devices are spaced apart along the first direction by a first-direction target gap and along the second direction by a second-direction target gap to form an array of the micro-component devices, wherein the first-direction target gap and the second-direction target gap are smaller than the corresponding first-direction initial gap and the second-direction initial gap; and
   transferring the array of the micro-component devices onto a carrier substrate, wherein the first-direction target gap and the second-direction target gap are maintained.

2. The method according to claim 1, further comprising:
   providing a conductive wire assembly, wherein the conductive wire assembly includes a plurality of first conductive wires along the first direction and a plurality of second conductive wires along the second direction, the conductive wire assembly further defines a plurality of grids, and each of the grids is formed by two adjacent ones of the first conductive wires and two adjacent ones of the second conductive wires;
   aligning the micro-component devices with the grids of the conductive wire assembly such that the micro-component devices are located inside respective ones of the grids of the conductive wire assembly;
   applying currents to the first conductive wires to generate magnetic fields and actuate the first conductive wires to move closer to each other such that the micro-component devices are moved closer to each other along the second direction; and
   applying currents to the second conductive wires to generate magnetic fields and actuate the second conductive wires to move closer to each other such that the micro-component devices are moved closer to each other along the first direction.

3. The method according to claim 2, wherein the micro-component devices are floated on the liquid suspending medium after the micro-component devices are disposed to be located inside respective ones of the grids of the conductive wire assembly.

4. The method according to claim 2, wherein the micro-component devices are located inside respective ones of the grids of the conductive wire assembly after the micro-component devices are disposed to float on the liquid suspending medium.

5. The method according to any one of claims 1 to 4, wherein disposing the micro-component devices to float on the liquid suspending medium further comprises:
   disposing the micro-component devices on a temporary carrier substrate, wherein the micro-component devices are spaced apart along the first direction by the first-direction initial gap and along the second direction by the second-direction initial gap;
   immersing the temporary carrier substrate in the liquid suspending medium; and
   releasing the micro-component devices from the temporary carrier substrate to be floating on the liquid suspending medium.

6. The method according to claim 5, wherein the micro-component devices are adhered to the temporary carrier substrate or are adsorbed to the temporary carrier substrate.

7. The method according to any one of claims 1 to 4, wherein each of the micro-component devices comprises a light-emitting diode (LED) chip, the LED chip comprising an upper surface, a lower surface, an edge surface, and a set of electrodes, and the set of electrodes is disposed on the lower surface.

8. The method according to claim 7, wherein each of the micro-component devices further comprises an auxiliary structure disposed on the upper surface or disposed along the edge surface of the LED chip, and a mass density of the auxiliary structure is less than a mass density of the LED chip.

9. The method according to claim 8, wherein the auxiliary structure comprises a magnetic material; wherein disposing the micro-component devices to float on the liquid suspending medium further comprises:
applying a magnetic field to magnetize the auxiliary structures of the micro-component devices, such that repulsive forces are generated among the micro-component devices along the first direction and the second direction, and the micro-component devices are spaced apart by the first-direction initial gap and the second-direction initial gap.

10. The method according to claim 8, wherein disposing the micro-component devices to float on the liquid suspending medium further comprises:
applying an electric field to induce electrostatic charges in the auxiliary structures of the micro-component devices, such that repulsive forces are generated among the micro-component devices along the first direction and the second direction, and the micro-component devices are spaced apart by the first-direction initial gap and the second-direction initial gap.

11. The method according to claim 10, wherein the auxiliary structures comprise an electrostatic induction material.

12. The method according to claim 8, further comprising removing the auxiliary structures from the micro-component devices.

13. The method according to any one of claims 1 to 4, wherein transferring the array of the micro-component devices onto the carrier substrate comprises:
placing the carrier substrate below the micro-component devices; and
draining the liquid suspending medium to lower the micro-component devices to settle on the carrier substrate.

14. A micro-component device arrangement system comprising:
a liquid chamber module comprising a liquid chamber to accommodate a liquid suspending medium; and
a micro-component device arrangement module comprising a conductive wire assembly, wherein the conductive wire assembly comprises a plurality of first conductive wires along a first direction and a plurality of second conductive wires along a second direction, the first conductive wires and the second conductive wire are disposed in the liquid chamber, and the first direction is transverse to the second direction;
wherein:
the conductive wire assembly defines a plurality of grids, each of the grids being defined by two adjacent ones of the first conductive wires and two adjacent ones of the second conductive wires.

15. The micro-component device arrangement system according to claim 14, wherein the micro-component device arrangement module further comprises a power supply, and the power supply is connected to the conductive wire assembly to apply currents to the first conductive wires and the second conductive wires.

16. The micro-component device arrangement system according to claim 14, wherein the liquid chamber module further comprises a first valve and a second valve, wherein the first valve and the second valve are connected to the liquid chamber, and are configured to drain the liquid suspending medium from the liquid chamber and to inject the liquid suspending medium into the liquid chamber, respectively.

17. The micro-component device arrangement system according to any one of claims 14 to 16, further comprising at least one of:
a magnetic field generator to generate a magnetic field in the liquid chamber; or
an electric field generator to generate an electric field in the liquid chamber.

18. The micro-component device arrangement system according to any one of claims 14 to 16, further comprising a control module connected to the liquid chamber module and the micro-component device arrangement module, the control module being configured to control and coordinate operation of the liquid chamber module and the micro-component device arrangement module.

19. A method of arranging micro-component devices, comprising:
disposing a plurality of micro-component devices to float on a liquid suspending medium, wherein the micro-component devices are spaced apart in an initial array having an initial density of the micro-component devices;
actuating the micro-component devices floating on the liquid suspending medium to move closer to each other such that the micro-component devices are spaced apart in a target array having a target density of the micro-component devices that is greater than the initial density; and
transferring the array of the micro-component devices onto a carrier substrate, while maintaining the target density.

* * * * *